(12) United States Patent
Ghasemazar et al.

(10) Patent No.: US 11,245,415 B2
(45) Date of Patent: Feb. 8, 2022

(54) DYNAMIC CLUSTERING-BASED DATA COMPRESSION

(71) Applicant: The University of British Columbia, Vancouver (CA)

(72) Inventors: Amin Ghasemazar, Vancouver (CA); Prashant Jayaprakash Nair, Burnaby (CA); Mieszko Lis, Vancouver (CA)

(73) Assignee: THE UNIVERSITY OF BRITISH COLUMBIA UNIVERSITY-INDUSTRY LIAISON OFFICE, Vancouver (CA)

( * ) Notice: Subject to any disclaimer, the term of this patent is extended or adjusted under 35 U.S.C. 154(b) by 0 days.

(21) Appl. No.: 17/200,403

(22) Filed: Mar. 12, 2021

(65) Prior Publication Data

US 2021/0288659 A1 Sep. 16, 2021

Related U.S. Application Data

(60) Provisional application No. 62/989,072, filed on Mar. 13, 2020.

(51) Int. Cl.
*H03M 7/30* (2006.01)
*G06F 12/0895* (2016.01)

(52) U.S. Cl.
CPC ...... *H03M 7/3066* (2013.01); *G06F 12/0895* (2013.01); *G06F 2212/1044* (2013.01)

(58) Field of Classification Search
CPC ............... G06F 12/0895; G06F 12/00; G06F 2212/1044; G06F 13/00; H03M 7/3066
See application file for complete search history.

(56) References Cited

U.S. PATENT DOCUMENTS

| 8,751,462 | B2 | 6/2014 | Huang et al. | |
|---|---|---|---|---|
| 2006/0271761 | A1* | 11/2006 | Riemens | G06F 12/0802 711/212 |
| 2009/0070543 | A1* | 3/2009 | Oh | H04N 19/90 711/170 |
| 2012/0072641 | A1* | 3/2012 | Suzuki | G06F 12/0246 711/103 |

(Continued)

FOREIGN PATENT DOCUMENTS

WO 2018/139947 8/2018

OTHER PUBLICATIONS

D. Achlloptas. 2001. Database-friendly Random Projections. In PODS 2001.

(Continued)

*Primary Examiner* — Tuan V Thai
(74) *Attorney, Agent, or Firm* — Tarolli, Sundheim, Covell & Tummino LLP

(57) ABSTRACT

Methods, systems, and techniques for data compression. A cluster fingerprint of an uncompressed data block is determined to correspond to a cluster fingerprint of a base block stored in a base array. This determining involves looking up the cluster fingerprint of the first base block from the base array using the cluster fingerprint of the first uncompressed data block. The difference between the uncompressed data block and the base block is determined, and a compressed data block is encoded using this difference. The compressed data block is then stored in a data array.

30 Claims, 18 Drawing Sheets

(56) References Cited

U.S. PATENT DOCUMENTS

2016/0147447 A1* 5/2016 Blanco ................ G06F 16/28
711/154

OTHER PUBLICATIONS

A. Alameldeen and D. Wood. 2004. Frequent pattern compression: A significance-based compression scheme for L2 caches. Technical Report. University of Wisconsin-Madison Department of Computer Sciences.
A. R. Alameldeen and D. A. Wood. 2004. Adaptive cache compression for high-performance processors. In ISCA 2004.
A. Arelakis, F. Dahlgren, and P. Stenstrom. 2015. HyComp: A hy¬brid cache compression method for selection of data-type-specific compression methods. In MICRO 2015. 38-49.
Angelos Arelakis and Per Stenstrom. 2014. SC2: A Statistical Compres¬esion Cache Scheme. In ISCA 2014.
S. Baek, H. G. Lee, C. Nicopoulos, J. Lee, and J. Kim. 2013. ECM: Effec¬tive Capacity Maximizer for high-performance compressed caching. In HPCA 2013.
J. Bucek, K.-D. Lange, and J. von Kistowski. 2018. SPEC CPU2017—Next-generation Compute Benchmark. In ICPE 2018.
J. Buhler. 2001. Efficient large-scale sequence comparison by locality-sensitive hashing. Bioinformatics 17 (2001), 419-428.
M. S. Charikar. 2002. Similarity Estimation Techniques from Round-ing Algorithms. In STOC 2002.
X. Chen, L. Yang, R. P. Dick, L. Shang, and H. Lekatsas. 2010. C-Pack: A High-Performance Microprocessor Cache Compression Algorithm. IEEE Transactions on VLSI 18 (2010), 1196-1208.
D. Cheriton, A. Firoozshahian, A. Solomatnikov, J. P. Stevenson, and O. Azizi. 2012. HICAMP: Architectural Support for Efficient Concurrency-safe Shared Structured Data Access. In ASPLOS 2012.
O. Chum, J. Philbin, and A. Zissermnan. 2008. Near Duplicate Image Detection: min-Hash and tf-idf Weighting. In BMVC 2008.
T. E. Denehy and W. W. Hsu. 2003. Duplicate management for reference data. In Research Report R710305, IBM.
J. Dusser, T. Piquet, and A. Seznec. 2009. Zero-content Augmented Caches. In ICS 2009.
M. Ekman and P. Stenstrom. 2005. A Robust Main-Memory Compres¬sion Scheme. In ISCA 2005.
A. M. Elkahky, Y. Song, and I. He. 2015. A Multi-View Deep Learning Approach for Cross Domain User Modeling in Recom-mendation Systems. In WWW 2015.
M. Ester, H.-P. Kriegel, J. Sander, and X. Xu. 1996. A density-based algorithm for discovering clusters in large spatial databases with noise. In KDD 1996.
S. Fox, S. Tridgell, C. Jin, and P. H. W. Leong. 2016, Random projections for scaling machine learning on FPGAs. In FPT 2016.
P. Frankl and H. Maehara. 1988. The Johnson-Lindenstrauss lemma and the sphericity of some graphs, journal of Combinatorial Theory, Series B 44 (1988), 355-362.
J. Gaur, A. R. Alameldeen, and S. Subramoney. 2016. Base-Victim Compression: An Opportunistic Cache Compression Architecture. In ISCA 2016.
A. Ghasemazar, M. Ewais, P. Nair, and M. Lis. 2020. 2DCC: Cache Compression in Two Dimensions. In DATE 2020.
M. Ghayoumi, M. Gomez, K. E. Baumstein, N. Persaud, and A. J. Per-Iowin. 2018. Local Sensitive Hashing (LSH) and Convolutional Neural Networks (CNNs) for Object Recognition. In ICMLA 2018.
A. Gionis, P. Indyk, and R. Motwani. 1999. Similarity Search in High Dimensions via Hashing. In VLDB 1999.
B. Hong, D. Plantenberg, D. D. E. Long, and M. Sivan-Zimet. 2004. Duplicate Data Elimination in a SAN File System. In MSST 2004.
P. Indyk and R. Motwani. 1998. Approximate Nearest Neighbors: Towards Removing the Curse of Dimensionality. In STOC.
M. M. Islam and P. Stenstrom. 2010. Characterization and Exploi-tation of Narrow-width Loads: The Narrow-width Cache Approach. In CASES 2010.
W. Johnson and J. Lindenstrauss. 1982. Extensions of Lipschitz map¬pings into a Hilbert space. Conference in Modern Analysis and Proba-bility 26 (1982), 189-206.
J. Kim, M. Sullivan, E. Choukse, and M. Erez. 2016. Bit-plane Com-pression: Transforming Data for Better Compression in Many-core Architectures. In ISCA 2016.
S. Kottapalli and J. Baxter. 2009. Nehalem-EX CPU Architecture. In HotChips 2009.
P. Li, T. J. Hastie, and K. W. Church, 2006, Very Sparse Random Projections. In KDD 2006.
W. Liu, H. Wang, Y. Zhang, W. Wang, and L. Qin. 2019. I-LSH: I/O Efficient c-Approximate Nearest Neighbor Search in High-Dimensional Space. In ICDE 2019. 1670-1673.
J. MacQueen. 1967. Some methods for classification and analysis of multivariate observations. In Berkeley symposium on mathematical statistics and probability 1967.
N. Muralimanohar, R. Balasubramonian, and N. Jouppi. 2007. Optimiz¬ing NUCA Organizations and Wiring Alternatives for Large Caches with CACTI 6.0. In MICRO 2007.
T. M. Nguyen and D. Wentzlaff. 2015. MORC: A Manycore-oriented Compressed Cache. In MICRO 2015 (Waikiki, Hawaii). ACM, New York, NY, USA, 76-88.
J. Pan and D. Manocha. 2011. Fast GPU-based Locality Sensitive Hashing for K-nearest Neighbor Computation. In GIS 2011.
B. Panda and A. Seznec. 2016. Dictionary Sharing: An Efficient Cache Compression Scheme for Compressed Caches. In MICRO 2016.
G. Pekhimenko, T. Huberty, R. Cai, O. Mutlu, P. B. Gibbons, M. A. Kozuch, and T. C. Mowry. 2015. Exploiting compressed block size as an indicator of future reuse. In HPCA 2015.
G. Pekhimenko, V. Seshadri, O. Mutlu, M. A. Kozuch, P. B. Gibbons, and T. C. Mowry. 2012. Base-delta-immediate compres-sion: Practical data compression for on-chip caches. In PACT 2012.
M. K. Qureshi, D. Thompson, and Y. N. Patt. 2005. The V-Way Cache: Demand Based Associativity via Global Replacement. In ISCA 2005.
J. San Miguel, J. Albericio, N. Enright Jerger, and A. Jaleel. 2016. The bunker cache for spatio-value approximation. In MICRO 2016.
J. San Miguel, J. Albericio, A. Moshovos, and N. Enright Jerger. 2015. Doppelganger: a cache for approximate computing. In MICRO 2015.
D. Sanchez and C. Kozyrakis. 2013. ZSim: Fast and Accurate Microar-chitectural Simulation of Thousand-core Systems. In ISCA 2013.
S. Sardashti, A. Seznec, and D. A. Wood. 2014. Skewed Com-pressed Caches. In MICRO 2014.
S. Sardashti, A. Seznec, and D. A. Wood. 2016. Yet Another Compressed Cache: A Low-Cost Yet Effective Compressed Cache. ACM Trans. Archit. Code Optim. 13 (2016), 27:1-27:25.
S. Sardashti and D. A. Wood. 2013. Decoupled Compressed Cache: Exploiting Spatial Locality for Energy-optimized Compressed Cach-ing. In MICRO 2013.
S. Sardashti and D. A. Wood. 2014. Decoupled Compressed Cache: Exploiting Spatial Locality for Energy Optimization. IEEE Micro 34 (2014), 91-99.
T. Singh, S. Rangarajan, D. John, C. Henrion, S. Southard, H. McIntyre, A. Novak, S. Kosonocky, R. Jotwani, A. Schaefer, E. Chang, J. Bell, and M. Co. 2017. Zen: A next-generation high-performance x86 core. In ISSCC 2017.
G. Singh Manku, A. Jain, and A. Das Sarma. 2007. Detecting Near-duplicates for Web Crawling. In WWW 2007.
D. Skarlatos, N. S. Kim, and J. Torrellas. 2017. PageForge: A Near-Memory Content-Aware Page-Merging Architecture. In MICRO 2017. 302-314.
R. Spring and A. Shrivastava. 2017. Scalable and Sustainable Deep Learning via Randomized Hashing. In KDD 2017.
W. J. Starke. 2009. POWER7: IBM's Next Generation, Balanced POWER Server Chip. In HotChips 2009.
J. E. Stine, J. Chen, I. Castellanos, G. Sundararajan, M. Qayam, P. Kumar, J. Remington, and S. Sohoni. 2009. FreePDK v2.0: Transition-ing VLSI education towards nanometer variation-aware designs. In MSE 2009.

(56) References Cited

OTHER PUBLICATIONS

J. Stuecheli and W. J. Starke. 2018. The IBM POWERS Scale Up Processor. In HotChips 2018.
Y. Tian, S. M. Khan, D. A. Jimenez, and G. H. Loh. 2014. Last-level Cache Deduplication. In ICS 2014 (Munich, Germany). 53-62.
P.-A. Tsai and D. Sanchez. 2019. Compress Objects, Not Cache Lines: An Object-Based Compressed Memory Hierarchy. In ASPLOS 2019.
P. R. Wilson, S. F. Kaplan, and Y. Smaragdakis. 1999. The Case for Compressed Caching in Virtual Memory Systems. In ATEC 1999.
J. Zheng and J. Luo. 2013. A PG-LSH Similarity Search Method for Cloud Storage. In CIS 2013.

\* cited by examiner

DYNAMIC CLUSTERING-BASED DATA COMPRESSION

CROSS-REFERENCE TO RELATED APPLICATION

The present application claims priority to U.S. provisional patent application No. 62/989,072 filed on Mar. 13, 2021, and entitled "Dynamic Clustering-Based Online Memory Compression", the entirety of which is hereby incorporated by reference herein.

TECHNICAL FIELD

The present disclosure is directed at methods, systems, and techniques for dynamic clustering-based data compression.

BACKGROUND

Generally speaking, data compression is useful in that for a memory of a given capacity, more data can be stored on that memory when that data is compressed compared to when it is uncompressed. For certain types of memory, such as caches, additional technical considerations make data compression potentially useful. For example, over the past decade, on-chip last-level cache (LLC) capacity has grown substantially, from 24 MB to 64 MB for SRAM and 30 MB to 120 MB for eDRAM. Due to the slowdown of Moore's Law, however, further growth in capacity of LLCs is becoming increasingly difficult.

SUMMARY

According to a first aspect, there is provided a data compression method comprising: determining that a cluster fingerprint of a first uncompressed data block corresponds to a cluster fingerprint of a first base block stored in a base array, wherein the determining comprises looking up the cluster fingerprint of the first base block from the base array using the cluster fingerprint of the first uncompressed data block; determining a difference between the first uncompressed data block and the first base block; encoding a first compressed data block as a difference between the first uncompressed data block and the first base block; and storing the first compressed data block in a data array.

The compressed data block may be encoded as: an identifier identifying which bits of the first uncompressed data block differ from the first base block; and a first sequence of differing bits that differ between the first uncompressed data block and the first base block.

The identifier may comprise a bitmask.

The identifier may comprise indices identifying the bits of the first uncompressed data block that differ from the first base block.

The data array may comprise a map identifying a location of the first compressed data block in the data array, and the method may further comprise: receiving an access request, the access request comprising a fingerprint array index; retrieving a segment index and the cluster fingerprint of the first base block from a fingerprint array storing one or more base block fingerprints using the fingerprint array index; retrieving the first base block from the base array using the cluster fingerprint of the first base block; retrieving the first compressed data block from the data array using the segment index and the map; and decompressing the first compressed data block using: the first base block; and the difference between the first uncompressed data block and the first base block.

The method may further comprise: determining that a cluster fingerprint of a second uncompressed data block corresponds to the cluster fingerprint of the first base block stored in the base array, wherein the determining comprises looking up the cluster fingerprint of the first base block from the base array using the cluster fingerprint of the second uncompressed data block; determining a difference between the second uncompressed data block and the first base block; encoding a second compressed data block as a difference between the second uncompressed data block and the first base block; and storing the second compressed data block in the data array.

The data array may comprise a map that identifies locations of respective data blocks in the data array and that comprises validity fields representing whether the respective blocks are valid, and the method may further comprise: determining that the first compressed data block is to be evicted from the data array in order to make space in the data array available for storage of the second compressed data block; setting the validity field of the map for the first compressed data block to invalid; evicting the first compressed data block from the data array, wherein the second compressed data block is stored in the data array at a location corresponding to a location previously occupied by the evicted first compressed data block; and setting the validity field of the map previously corresponding to the first compressed data block to valid.

The method may further comprise: determining that a cluster fingerprint of a second uncompressed data block corresponds to none of the base block fingerprints stored in the base array; determining that the first base block is unused for data compression; replacing the first base block in the base array with a second base block; and encoding a second compressed data block as a difference between the second uncompressed data block and the second base block.

The second uncompressed data block may be stored as the second base block, and the second compressed data block may be encoded to indicate that the second uncompressed data block is identical to the second base block.

Determining that the cluster fingerprint of the first uncompressed data block corresponds to the cluster fingerprint of the first base block may comprise determining a similarity probability satisfies a probability threshold, and the similarity probability may be a likelihood that a difference in distance metrics represents the cluster fingerprints satisfies a distance threshold.

Determining the similarity probability satisfies the probability threshold may comprise determining that a locality-sensitive hash of the first uncompressed data block is identical to a locality-sensitive hash of the first base block.

Determining the locality-sensitive hash of the first uncompressed data block or the first base block may comprise: multiplying the first uncompressed data block or the first base block by a matrix with entries selected from $\{-1,0,1\}$ to arrive at an intermediate vector product; and determining the locality-sensitive hash based on whether each scalar entry comprising the intermediate vector product is positive or negative.

The data array may comprise part of a cache and the fingerprint array may comprise a tag array of the cache.

The data array may comprise part of random access memory and the fingerprint array may comprise a page table of the random access memory.

According to another aspect, there is provided a non-transitory computer readable medium having stored thereon computer program code that is executable by a processor and that, when executed by the processor, causes the processor to perform a data compression method comprising: determining that a cluster fingerprint of a first uncompressed data block corresponds to a cluster fingerprint of a first base block stored in a base array, wherein the determining comprises looking up the cluster fingerprint of the first base block from the base array using the cluster fingerprint of the first uncompressed data block; determining a difference between the first uncompressed data block and the first base block; encoding a first compressed data block as a difference between the first uncompressed data block and the first base block; and storing the first compressed data block in a data array.

According to another aspect, there is provided a system comprising: a memory having stored thereon: a base array storing the first base block; and a data array; and a controller communicatively coupled to the memory and configured to perform a method comprising: determining that a cluster fingerprint of a first uncompressed data block corresponds to a cluster fingerprint of a first base block stored in a base array, wherein the determining comprises looking up the cluster fingerprint of the first base block from the base array using the cluster fingerprint of the first uncompressed data block; determining a difference between the first uncompressed data block and the first base block; encoding a first compressed data block as a difference between the first uncompressed data block and the first base block; and storing the first compressed data block in the data array.

The compressed data block may be encoded as: an identifier identifying which bits of the first uncompressed data block differ from the first base block; and a first sequence of differing bits that differ between the first uncompressed data block and the first base block.

The identifier may comprise a bitmask.

The identifier may comprise indices identifying the bits of the first uncompressed data block that differ from the first base block.

The memory may have stored thereon a fingerprint array storing one or more base block fingerprints, and the data array may comprise a map identifying a location of the first compressed data block in the data array, and the method that the controller is configured to perform may further comprise: receiving an access request, the access request comprising a fingerprint array index; retrieving a segment index and the cluster fingerprint of the first base block from the fingerprint array using the fingerprint array index; retrieving the first base block from the base array using the cluster fingerprint of the first base block; retrieving the first compressed data block from the data array using the segment index and the map; and decompressing the first compressed data block using: the first base block; and the difference between the first uncompressed data block and the first base block.

The method that the controller is configured to perform may further comprise: determining that a cluster fingerprint of a second uncompressed data block corresponds to the cluster fingerprint of the first base block stored in the base array, wherein the determining comprises looking up the cluster fingerprint of the first base block from the base array using the cluster fingerprint of the second uncompressed data block; determining a difference between the second uncompressed data block and the first base block; encoding a second compressed data block as a difference between the second uncompressed data block and the first base block; and storing the second compressed data block in the data array.

The data array may comprise a map that identifies locations of respective data blocks in the data array and that comprises validity fields representing whether the respective blocks are valid, and the method that the controller is configured to perform may further comprise: determining that the first compressed data block is to be evicted from the data array in order to make space in the data array available for storage of the second compressed data block; setting the validity field of the map for the first compressed data block to invalid; evicting the first compressed data block from the data array, wherein the second compressed data block is stored in the data array at a location corresponding to a location previously occupied by the evicted first compressed data block; and setting the validity field of the map previously corresponding to the first compressed data block to valid.

The method that the controller is configured to perform may further comprise: determining that a cluster fingerprint of a second uncompressed data block corresponds to none of the base block fingerprints stored in the base array; determining that the first base block is unused for data compression; replacing the first base block in the base array with a second base block; and encoding a second compressed data block as a difference between the second uncompressed data block and the second base block.

The second uncompressed data block may be stored as the second base block, and the second compressed data block may be encoded to indicate that the second uncompressed data block is identical to the second base block.

Determining that the cluster fingerprint of the first uncompressed data block corresponds to the cluster fingerprint of the first base block may comprise determining a similarity probability satisfies a probability threshold, and the similarity probability may be a likelihood that a difference in distance metrics representing the cluster fingerprints satisfies a distance threshold.

Determining the similarity probability satisfies the probability threshold may comprise determining that a locality-sensitive hash of the first uncompressed data block is identical to a locality-sensitive hash of the first base block.

Determining the locality-sensitive hash of the first uncompressed data block or the first base block may comprise: multiplying the first uncompressed data block or the first base block by a matrix with entries selected from $\{-1,0,1\}$ to arrive at an intermediate vector product; and determining the locality-sensitive hash based on whether each scalar entry comprising the intermediate vector product is positive or negative.

The system may further comprise an adder tree having an output communicatively coupled to a comparator, and the first uncompressed data block or the first base block may be input to the adder tree and the comparator may then output the locality-sensitive hash of the first uncompressed data block or the first base block.

The data array may comprise part of a cache comprising multiple cachelines, the fingerprint array may comprise a tag array of the cache, and the adder tree and the comparator may determine the locality-sensitive hash for at least one of the cachelines.

The data array may comprise part of random access memory and the fingerprint array may comprise a page table of the random access memory.

This summary does not necessarily describe the entire scope of all aspects. Other aspects, features and advantages will be apparent to those of ordinary skill in the art upon review of the following description of specific embodiments.

BRIEF DESCRIPTION OF THE DRAWINGS

In the accompanying drawings, which illustrate one or more example embodiments.

DETAILED DESCRIPTION

Compression can, in certain contexts, be advantageous when applied to data stored in digital storage structures such as memories, flash storage, disk storage, and similar types of media. Described herein are methods, systems, and techniques in which data are stored as blocks and accessed by providing an address. Blocks may be stored sequentially by address (as, for example, in a DRAM memory attached to a processor in a computing system), or non-sequentially (as, for example, in a cache memory inside a computing system).

Because blocks are identified and accessed by their addresses, access patterns include those where blocks are accessed in an order different than the order in which they are stored in the storage structure (this is known as random access). This is in contrast to access patterns where blocks are accessed one after another in an ordered sequence (known as a streaming access pattern). The various embodiments described herein are effective for both random-access and streaming patterns.

Figure 23:
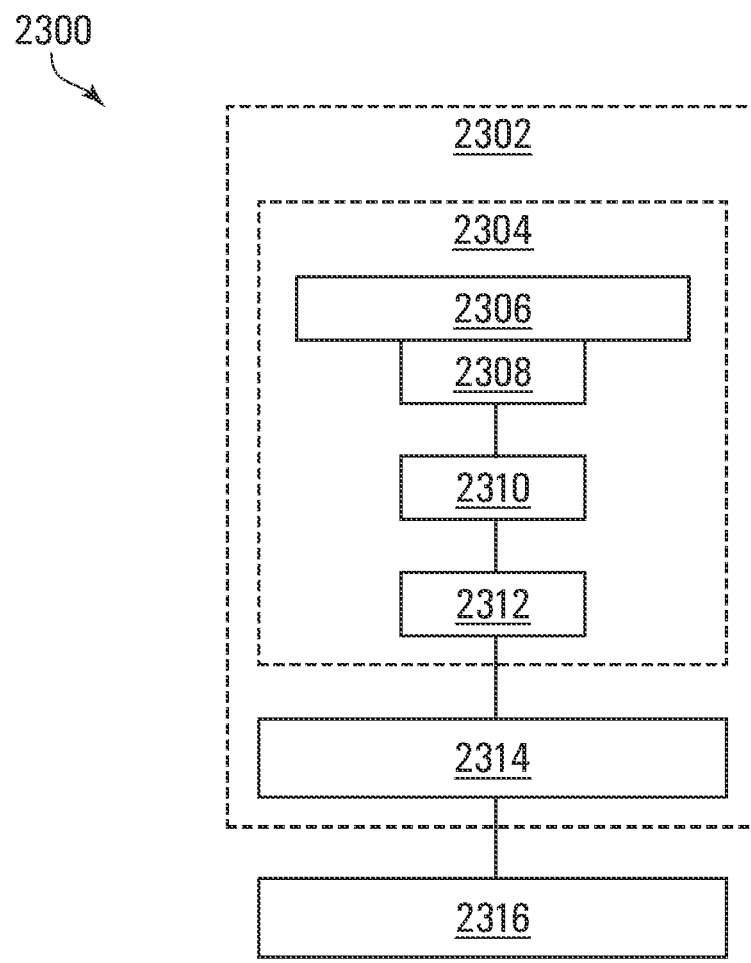
FIG. 23 depicts a system comprising multiple caches for performing dynamic clustering-based data compression, according to an example embodiment.

FIG. 23 depicts an example system 2300 comprising various types of memory. More particularly, the system 2300 comprises a processor 2302, which itself comprises a processor core 2304. On the processor core 2304 are three types of memory that are communicatively coupled to each other: in order of fastest to slowest, they are registers 2308, L1 cache 2310, and L2 cache 2312. Comprising part of the processor 2302 although not the processor core 2304 is the last-level cache 2314, or the L3 cache/LLC. Off processor is non-cached local memory 2316, such as one or more types of random access memory (e.g., SRAM, DRAM).

As described further below, at least some embodiments are applied to compress the contents of the LLC in a digital computing system such as, for example, a server, a personal computer, and a mobile phone. Other applications may include other cache-like structures, including processor Translation Lookaside Buffers (TLBs), virtual memory paging systems, key-value stores like memcached, etc. At least some embodiments may also be applied to compressing structures that do not function as caches, including scratchpads memories, main memories, flash and disk storage, and databases.

In the context of caches and LLCs in particular, Moore's Law is making it difficult to rely on continued increases in cache size for performance gains. As an alternative, researchers have explored programmer-transparent data compression techniques for the LLC. These techniques generally fall into two classes: (a) intra-cacheline compression, which places multiple memory blocks within each cacheline, and (b) inter-cacheline deduplication, which helps capture data redundancy across cacheline boundaries by detecting identical cachelines and storing only a single copy.

In at least some embodiments described herein, compression can be significantly improved—to 2.25×geomean—by clustering memory blocks that have nearly identical, rather than exact, data values. In at least some embodiments herein, dynamic inter-cacheline compression methods and systems that use dynamic clustering to efficiently detect and compress groups of similar memory blocks are described.

LLC-based compression can work with regularity in the structure in the organization of the cached data, which implies limited entropy in the cached data. For instance, intra-cacheline compression schemes take advantage of low entropy of data within a small memory block (e.g., a cacheline) by compressing each block independently. These cachelines in an LLC snapshot of mcf that can be deduplicated with at least one other cacheline if differences up to n bytes are permitted for 0≤n≤64. The working set contains very few duplicate memory blocks, making exact deduplication ineffective. Below is a listing of two clusters of near-duplicate cachelines from mcf:

| | | | | | |
|---|---|---|---|---|---|
| $l_1$: | 00002AAAC02419D8 | 00002AAAC0237610 | 0000000000000000 | FFFFFFFFFECEF790 | 00006A04FFFFFE67 . . . |
| $l_2$: | 00002AAAC024B8B0 | 00002AAAC023EE60 | 0000000000000000 | FFFFFFFFFECEF73C | 00006A2CFFFFEEE7 . . . |
| $l_3$: | FFFFFFFFFFFFFFC4 | 00002AAAC11FE988 | 0000000000000000 | 0000000001312724 | FFFFFFFFFECED8DC . . . |
| $l_4$: | FFFFFFFFFFFFFFC4 | 00002AAAC11FA920 | 0000000000000000 | 00000000013123A0 | FFFFFFFFFECEDC60 . . . | can work well when the working set consists of arrays of primitive data types with a relatively low range of values. However, they do not capture the structural properties of more substantial, heterogeneous data structures, whose redundancy surfaces only when considering multiple cachelines.

Inter-cacheline compression, on the other hand, can exploit such scenarios by detecting and exploiting structure regularity across cacheline boundaries. Unfortunately, conventional inter-cacheline compression methods have significant drawbacks. Proposals like exact deduplication can only exploit data regularity if multiple LLC lines have exact data values, while techniques that directly leverage program-level data structure information may require at least in some instances pervasive program changes and ISA extensions. Cache compression methods that return approximate values work well for noise-resilient data (e.g., images), but are unsuitable for general-purpose workloads. At least some example embodiments of the compression method proposed herein overcome these limitations.

For architectures like CPUs, programmability and ease of use are important considerations. Thus, LLC compression techniques that are both programmer-transparent and general-purpose are preferable. Dedup (see Y. Tian, S. M. Khan, D. ZA. Jimenez, and G. H. Loh, 2014, Last-level Cache Deduplication in ICS 2014 (New York, N.Y., USA) at pp. 53-62) is the only inter-cacheline proposal that meets both criteria. Unfortunately, Dedup misses out on many compression opportunities because it requires multiple memory blocks to have exact data values.

Figure 1:
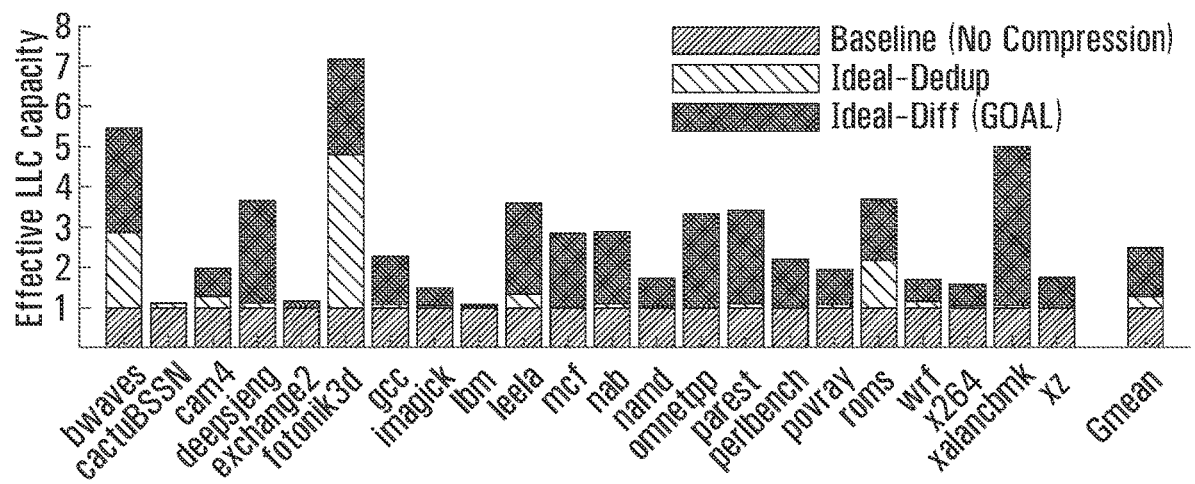
FIG. 1 depicts effective LLC capacity from data compression on the SPEC CPU 2017 suite.

To see how much opportunity is lost, consider an ideal inter-cacheline compression scheme that inserts data by searching the entire LLC for similar cachelines and stores only the bytes that differ ("diffs") from the most similar existing cacheline whenever this representation is smaller than an uncompressed cacheline; this setup is "Ideal-Diff". FIG. 1 shows the effective LLC capacity for (a) a system without compression, (b) an idealized deduplication scheme that also instantly searches the LLC for exact matches ("Ideal-Dedup"), and (c) Ideal-Diff, on the SPEC CPU 2017 suite (see J. Bucek, K. D. Lange, and J. von Kistowski, 2018, SPEC CPU2017—Next-generation Compute Benchmark in ICPE 2018, herein interchangeably referred to as "SPEC" or the "SPEC CPU 2017 suite"). The potential of detecting and compressing similar lines is significant: Ideal-Diff increases the LLC capacity by 2.5× over the baseline (geomean), compared to only 1.3× for Ideal-Dedup.

Figure 2:
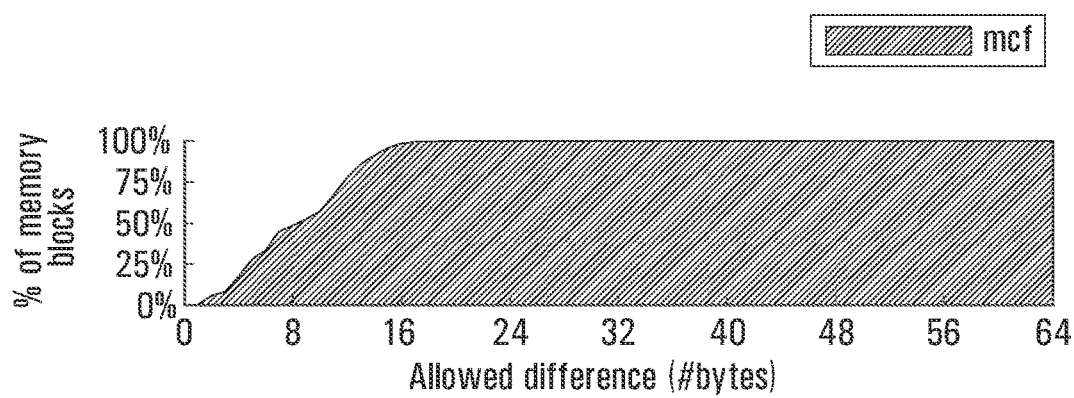
FIG. 2 depicts a fraction of 64-byte cachelines in an LLC snapshot of mcf that can be deduplicated with at least one other cacheline if differences of up to n bytes are permitted for $0 \leq n \leq 64$.

To achieve good compression with Ideal-Diff, the overheads of storing diffs must be low (i.e. the diffs must be relatively small). This tends to be true for a wide range of workloads. For example, FIG. 2 illustrates this using an LLC snapshot of the mcf workload from the SPEC CPU 2017 suite; more particularly, FIG. 2 depicts a fraction of 64-byte Intra-cacheline techniques also have limited effectiveness, as the primary datatype contains a variety of fields with different types and ranges:

Listing 1: The node data structure in mcf

```
struct node {
    val (8 Bytes) potential;
    val (4 Bytes) orientation;
    ptr (8 Bytes) child, pred
    ptr (8 Bytes) sibling, sibling_prev;
    ptr (8 Bytes) basic_arc, firstout;
    ptr (8 Bytes) firstin, arc_tmp;
    val (8 Bytes) flow;
    val (8 Bytes) depth;
    val (4 Bytes) number;
    val (4 Bytes) time;
};
```

On the other hand, exploiting similarity across cacheline boundaries and relaxing the exact-duplicate requirement is very effective: almost half of the cached memory blocks differ from another block by a maximum of 8 bytes, and nearly all memory blocks differ only by a maximum of 16 bytes. Therefore, significant LLC storage capacity is obtained by storing 16-byte diffs instead of full 64-byte blocks.

Unfortunately, working sets usually do not contain a single reference memory block around which all other memory blocks could cluster; on the contrary, several reference memory blocks with vastly different data values may be required. This is the case in mcf: lines $l_1 \ldots l_4$ come from the same node data structure in mcf, but only $\{l_1, l_2\}$ and $\{l_3, l_4\}$ are near-duplicate pairs. This is because node takes up 68 bytes (see Listing 1) and is not aligned to the 64-byte cacheline size. The misalignment naturally creates several "clusters," each with its own reference memory block referred to as the "clusteroid" or "base block" herein. To achieve effective compression, therefore, in at least some example embodiments multiple clusters are identified; in addition, because the contents are input-dependent, in at least some example embodiments this also happens dynamically at runtime.

At least some example embodiments are directed at a cache compression method and system that relies on efficient dynamic "clustering" of memory blocks in a memory such as the LLC or another level of cache (e.g., L1 or L2). To form clusters dynamically, at least some embodiments use locality-sensitive hashing (LSH), which produces the same hash for similar blocks and different hashes for dissimilar blocks. The cluster fingerprint, which is an LSH fingerprint in embodiments that rely on LSH, of an incoming memory block becomes its "cluster fingerprint": if other memory blocks with the same cluster fingerprint are already cached, only the difference between the new memory block and an existing reference memory block for that cluster (the "clusteroid" or "base block") is stored. Over time, as cluster members are evicted from the LLC, clusters that are not useful are naturally disbanded; this enables the system and method of at least some embodiments to adapt to changing workload phases by forming new clusters over time.

More particularly, as described further below and in at least some example embodiments:
(a) significant similarity in the data values of memory blocks across different cachelines for a broad range of workloads is demonstrated;
(b) an efficient LLC compression scheme based on clustering similar memory blocks using locality-sensitive hashing is described;
(c) the data compression scheme is applied using practical dynamic cluster-detection hardware suitable for inclusion near the LLC, including a novel, hardware-friendly locality-sensitive-hashing-based design; and
(d) a replacement policy for the data array in the LLC that balances the development of new clusters with conserving existing clusters is described.

Clusters of cachelines that are similar, but not necessarily identical, to one another are identified. To compress the cache, the base block of each cluster is stored together with the much smaller "cliffs" used to reconstruct the rest of the cluster. Implementation in at least some embodiments is performed using a hardware-level on-line cacheline clustering mechanism based on locality-sensitive hashing. At least some embodiments dynamically form clusters as they appear in the data access stream and retires them as they disappear from the cache.

Briefly, in at least some example embodiments, data blocks are classified into clusters by computing a cluster fingerprint, which is much shorter than the size of the block. In contrast to traditional clustering, where all blocks in for example a cache would be examined, at least some embodiments compute the cluster fingerprint based only the one block at hand (e.g., the block to be inserted into a cache). For example, as discussed further below at least some embodiments use LSH to efficiently compute the cluster fingerprint for a given block; other embodiments may determine this fingerprint differently, such as by applying dimensionality reduction, machine learning, etc. All blocks with the same cluster fingerprint are considered to belong to the same cluster.

For each cluster, a unique canonical block is constructed to represent the cluster; this block is known as the base block. The base block may be based on a sample of the blocks in the cluster (e.g., in at least some embodiments, it is the cluster centroid), or may be chosen differently; for example, as discussed further below, at least some embodiments use the first block seen in a given cluster as the base block.

When a new data block is stored in the storage data structure (e.g., a memory), it may be compressed by computing its difference with the cluster's base block that belongs to the same cluster, and using that to represent the new data block; if this representation is shorter than the original block, it may be stored in the data structure, achieving a compression effect. For example, the cache compression system described below computes this difference by identifying the bytes in the new data block that differ from its cluster's base block, and encoding the new data block as the cluster fingerprint, a bitfield in the form of a bitmask that identifies the differing bytes, and the values of the bytes that differ (a "sequence of differing bits"). For example, the encoding in at least some embodiments uses:
(a) a pointer to a base block in a separate table (a "base array" herein);
(b) a bitmask indicating which parts of the new data is different from the centroid (in byte granularity); and
(c) the bits that are different. As discussed further below, at least some embodiments encode a new data block as follows: New Data Block=[Ptr|mask|Diff].

Other embodiments may encode an arithmetic difference between the two blocks, a trigonometric (angle/magnitude) difference, an interpretable function that computes one block from the other, etc.

At least some embodiments use two logical storage structures: a data array, in which compressed data blocks and uncompressed data blocks are stored; and a base array that stores the base block for each cluster, addressed by the cluster's fingerprint. Each of the compressed and uncompressed data blocks are addressed by the block's address. In at least some other embodiments, the compressed data array and uncompressed data array may be distinct structures.

In some embodiments, compressed and uncompressed data arrays occupy the same physical structure (e.g., memory); in other embodiments they occupy separate data structures. Similarly, in some embodiments, the base array occupies the same physical structure as the compressed data array, the uncompressed data array, or both; in other embodiments, the base array is stored in a separate physical structure. For example, in at least some of the LLC examples below, the compressed and uncompressed data arrays share the same physical structure (the underlying cache's data array), while the base array is stored in main memory and cached using a small structure called the base cache.

As described further below, at least some example embodiments herein are evaluated using the SPEC CPU 2017 suite. The cache footprints for these benchmarks are dominated by a range of different data structures. At least some example embodiments compress the cache footprint up to 9.9× (2.25×geomean) when compared to an LLC that does not employ compression—a substantial improvement over the 1.28×(geomean) achieved by the inter-cacheline compression scheme Dedup and the 1.48× (geomean) achieved with the inter-cacheline scheme Base-Delta-Immediate (BAI) given the same silicon area. The effective compression frees up space to cache additional data, allowing at least some example embodiments to achieve speedups up to 27% (7.9% on average) over an uncompressed baseline on the cache-sensitive benchmarks.

Cache Organization and Compression using BAI and Deduplication

An LLC logically consists of several sets and each set contains multiple ways; modern LLCs have 4-8 ways per set. Physically, the LLC comprises tag and data arrays, usually with a dedicated tag and data array for each way in a set: e.g., an 8-way LLC has eight tag and eight data arrays. All ways in the set can be simultaneously queried during a cache access. Each cacheline in the data array is allocated one tag in its respective tag array: when an incoming memory block is placed in the LLC, it is assigned to the set that corresponds to its address, and replaces the tag and data entries for one of the ways. If this way previously contained valid data, this data is first evicted.

Figure 3:
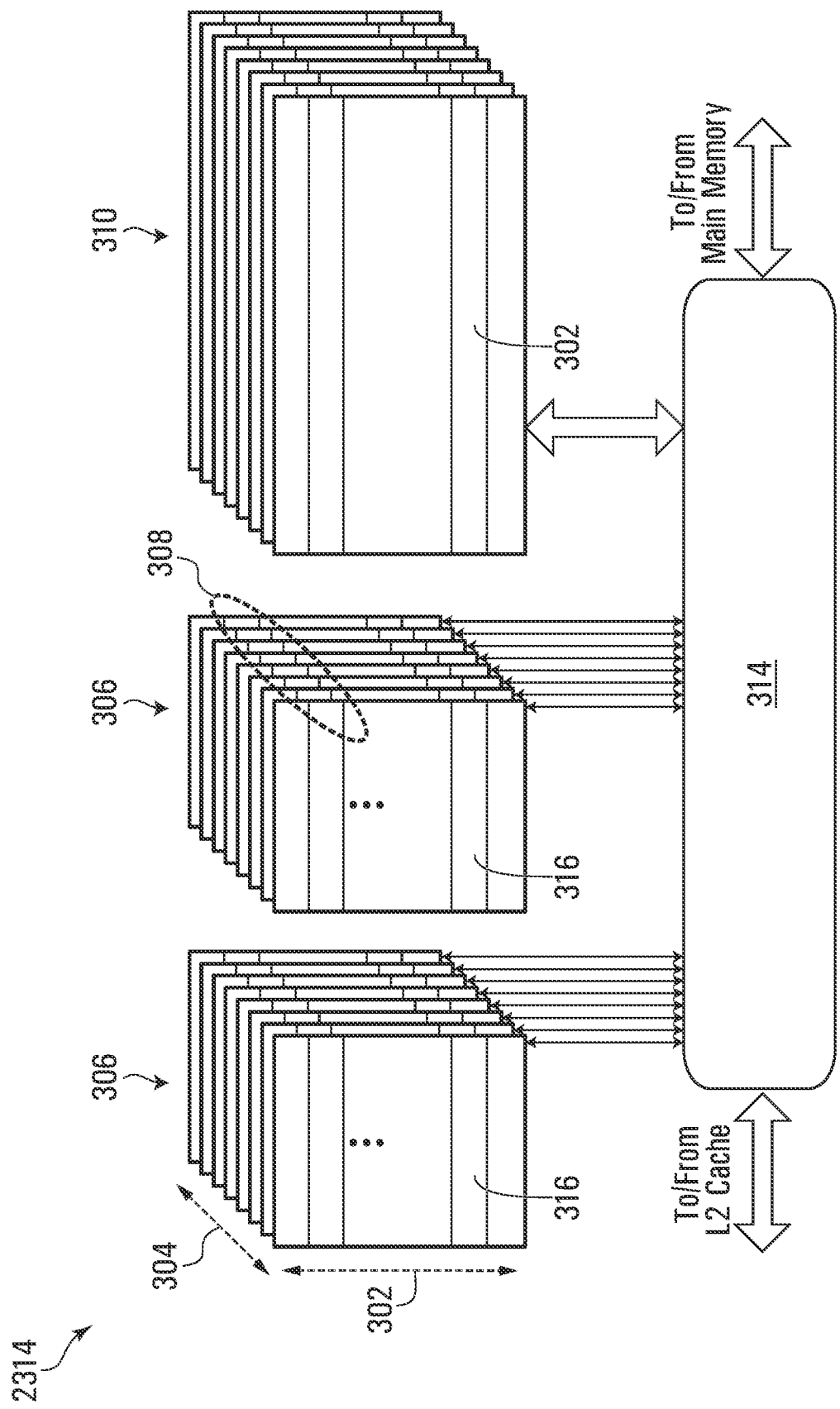
FIG. 3 depicts an LLC implementing BΔI compression.

A simple technique to increase the capacity of the LLC is to employ intra-cacheline compression. In this scheme, each incoming memory block is examined in isolation, and, if possible, compressed independently of other blocks. For example, BΔI compression, an intra-cacheline LLC compression technique described in G. Pekhimenko, V. Seshadri, O. Mutlu, M. A. Kozuch, P. B. Gibbons, and T. C. Mowry, 2012, Exploiting compressed block size as an indicator of future reuse in HPCA 2015, exploits that, in many workloads, data values within a memory block are similar, and therefore can be compressed as a "base" value combined with small offsets. To store up to two memory blocks per cacheline, BΔI doubles the number of tag arrays 306 for each way 304 in the LLC 2314, as shown in FIG. 3. More particularly, in FIG. 3 the LLC 2314 has multiple tag entries 316 (herein interchangeably referred to as "tags") per cacheline 302 to store additional tags 316 for each of the compressed memory blocks within the physical cacheline 302. Each set 308 spans multiple tags 316. An LLC controller 314 configured to implement the BΔI compression is communicative with the LLC 2314 itself as well as an L2 cache and main memory (not depicted in FIG. 3).

Figure 4:
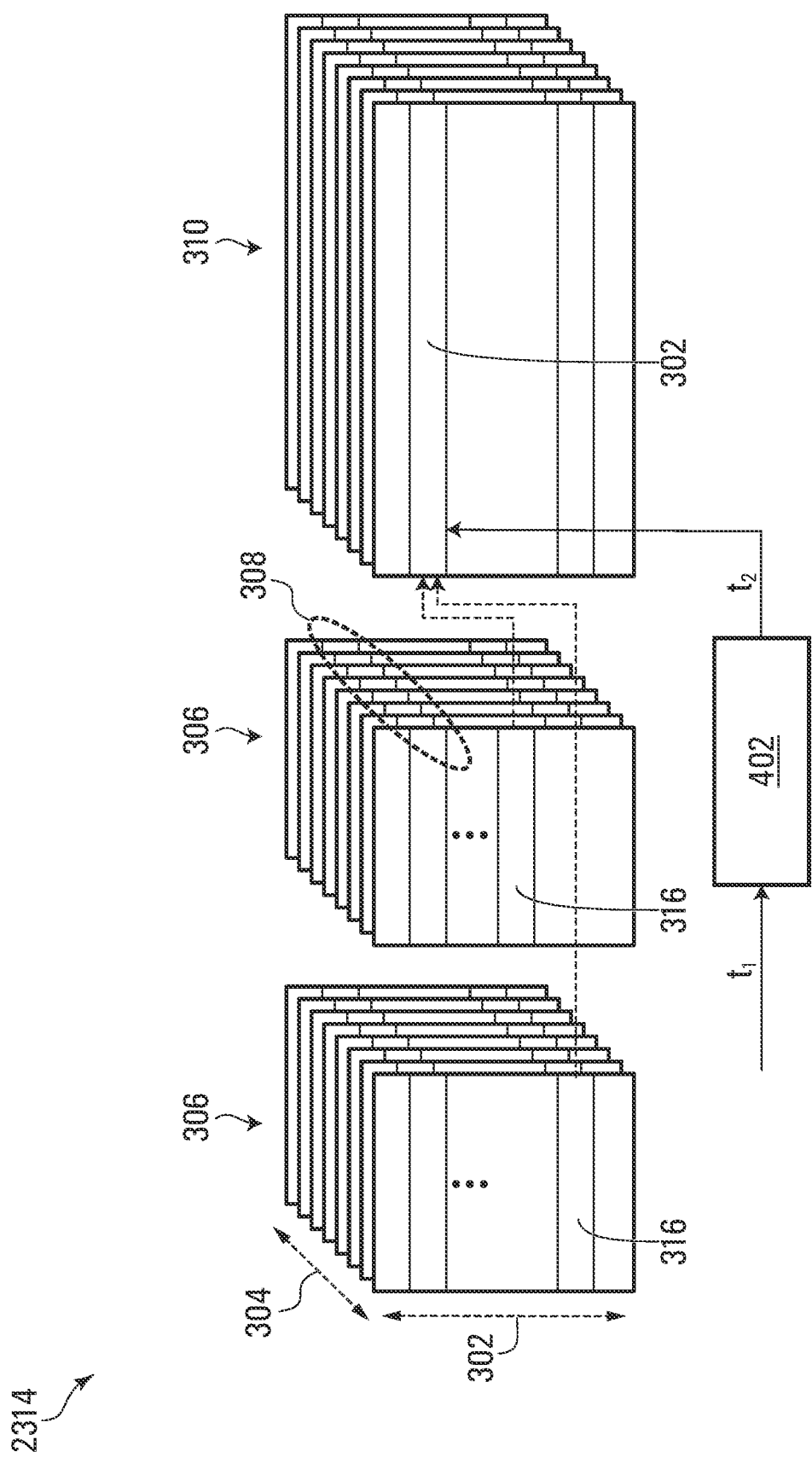
FIG. 4 depicts an LLC implementing deduplication.

In contrast, the inter-cacheline cache compression scheme Dedup exploits the existence of exactly identical memory blocks across the LLC in some workloads. As shown in FIG. 4, Dedup tries to store only a single copy of a block that would be represented by several copies in an uncompressed LLC. The challenge with Dedup is that probing the entire cache to search for duplicates is impractical (unlike compressing a single cacheline, as BΔI does). More particularly, FIG. 4 shows an LLC 2314 in which Dedup enables multiple tags 316 to point to the same cacheline 302 containing a common memory block. During the LLC insertion of the memory block, Dedup uses a hash table 402 of the most recently used data values to identify exactly identical cachelines.

The hash table 402 stores, for example, 16-bit fingerprints of 64-byte memory blocks and their locations in the data array. While a "hit" must be verified against the actual 64-byte block to avoid false matches, in practice collisions are rare. Because cached values have some temporal locality, using a limited-size hash table 402 with the most recently used fingerprints (e.g. up to 1024 hashes) covers most of the duplication in typical working sets.

In addition to the limitations due to the exact-match requirement, Dedup has two performance challenges. One is that, as shown in FIG. 4, data insertion involves a reference to the hash table (action at time $t_1$) followed by a reference into the LLC data array (action at time t2) to verify the exact contents of the memory block. Another limitation is that evicting a deduplicated memory block from the data array requires evicting all tags 316 that point to it; in turn, this means that the tag array entries 316 must contain two pointers to form a doubly-linked list for each deduplicated memory block value.

In-Cache Clustering

To determine whether in-cache clustering is practical, and three questions are relevant:
  (a) Do caches contain clusters with enough elements to provide substantial opportunities for compression?
  (b) Are there few clusters with clusteroids that could be hardcoded, or must clusteroids be computed at runtime?
  (c) Do cluster count and size vary among workloads enough to need a runtime-adaptive solution?

To answer these questions, dbscan clustering (see M. Ester, H. P. Kriegel, J. Sander, and X. Xu, 1996, A Density-based algorithm for discovering clusters in large spatial databases with noise in KDD 1996) was performed on LLC snapshots from the SPEC CPU 2017 suite, configuring similarity criteria for each workload to target 40% space savings. The experimental setup is idealized in two ways: (a) the algorithm sees the entire LLC at once rather than each memory block separately at insertion time, and (b) dbscan uses far more computation and storage than is practical to implement within a cache controller.

Figure 5:
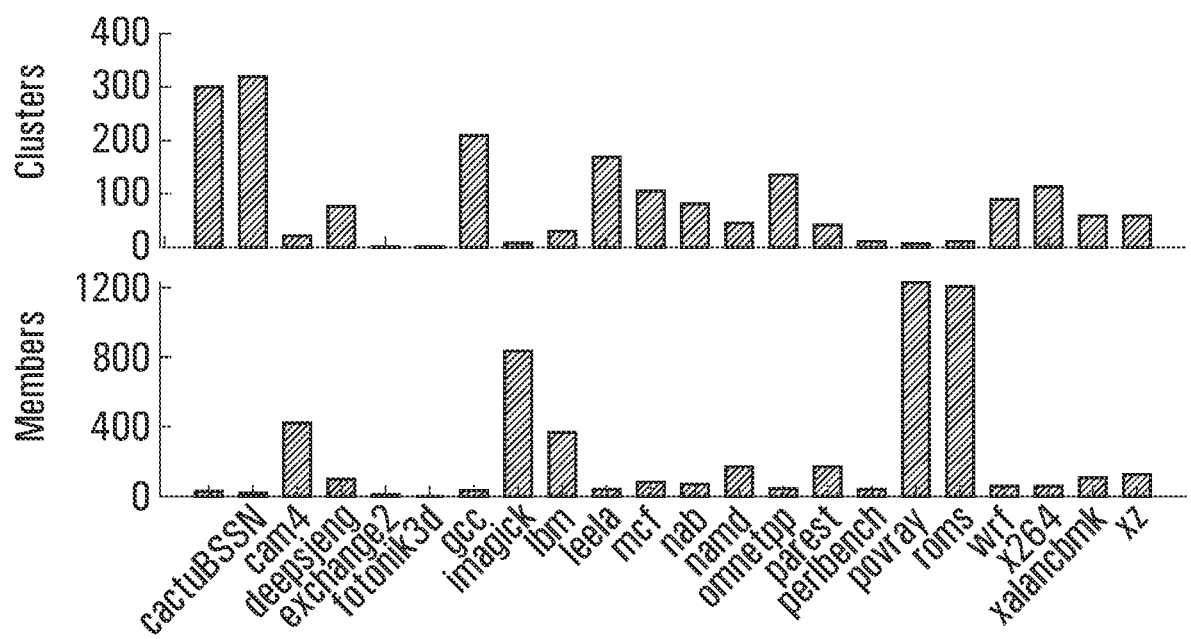
FIG. 5 depicts cluster parameters after applying DBSCAN to LLC snapshots from different SPEC workloads.

FIG. 5 shows cluster parameters after applying dbscan to LLC snapshots from different SPEC workloads. Workloads were run for 40B instructions after skipping the 100B instructions. Cluster distance was set to achieve an average 40% space savings in each snapshot. FIG. 5 shows that the LLC in most workloads has significant clusters of 10 or more members, with many exhibiting larger clusters of even 1,200 memory blocks (povray, roms). Because some workloads need many separate clusters to achieve substantial compression (e.g., bwaves and cactuBSSN), hard-coding cluster parameters in hardware is impractical. Finally, because cluster counts and sizes vary widely across the benchmark suite, clustering may be done dynamically at runtime, with performance considerations dictating a hardware-based or hardware-accelerated solution.

Dynamic Clustering

Directly applying clustering techniques to cache compression is complicated by two challenges. Firstly, cache contents can change as often as every few cycles as lines are inserted and evicted, so there is never a stable image "snapshot" to be analyzed. Secondly, any clustering performed by a cache controller should be both relatively quick (on the order of a few cycles) and inexpensive to implement in hardware. These requirements exclude common clustering algorithms like k-means or dbscan.

To overcome these challenges, in at least some embodiments an approximate clustering technique—one where a point is placed in the "correct" cluster with high probability, but can also end up in an entirely "wrong" cluster with low probability—is used for cache compression. This is because the few lines that end up in the wrong cluster can simply be stored uncompressed; provided this happens rarely, the compression ratio is not significantly affected.

At least some embodiments accordingly use a dynamic approximate clustering mechanism based on locality-sensitive hashing (see P. Indyk and R. Motwani, 1998, Approximate Nearest Neighbors: Towards Removing the Curse of Dimensionality in STOC).

More particularly, a family of hash functions is created that maps points in some metric space to discrete buckets, so that the probability of hash collision is high for nearby points but low for points that are far away from each other. Specifically, given two points x and y in an d-dimensional real space $\mathbb{R}^d$ with a distance metric II x, y II, a family of hash functions $\mathcal{H}$ is called "locality-sensitive" if it satisfies two conditions:
  1. if $\|x, y\| \leq r_1$, then $\Pr[h(x)=h(y)] \geq p_1$, and
  2. if $\|x, y\| > r_2$, then $\Pr[h(x)=h(y)] \leq p_2$
when h is chosen uniformly at random from $\mathcal{H}$, $r_1 < r_2$ are distances, $\Pr[h(x)=h(y)]$ are similarity probabilities, and $p_1 > p_2$ are probability thresholds. In the context of cache compression, at least some embodiments use a distance metric that (a) correlates with the number of bytes needed to encode the difference between x and y, and (b) is easy to evaluate, such as the $\ell_1$ metric. Typically, $r_2 = (1+\varepsilon)r_1$ for some small $\varepsilon > 0$.

To see how such a hash family could be created, consider the space $\{0,1\}^d$ of d-bit strings under the Hamming distance metric, and, without loss of generality, choose two bit strings x and y in this space. Let $\mathcal{H} = \{h_1, \ldots, h_d\}$, where $h_i$ simply selects the ith bit of its input. Intuitively, if $\|x, y\|$ is small (i.e., few bits differ), the probability that $h_i(x) \neq h_i(y)$ (i.e., selecting a different bit) with a randomly selected $h_i$ will be small; in contrast, if ||x, y|| is large (i.e., many bits differ), the probability that $h_t(x) \neq h_t(y)$ will be high. Observe that the difference between the two probabilities will be amplified if an $h_t$ is selected at random and x and y are required to match under both $h_t$ and $h_t$ to conclude that $h(x)=h(y)$.

Figures 6A, 6B, 6C:
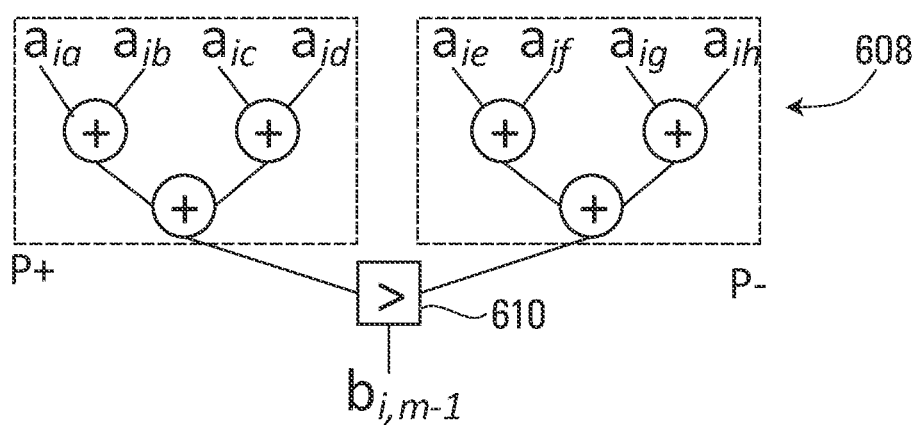
FIGS. 6A, 6B and 6C depict a hardware implementation for determining a locality-sensitive hash using an adder tree and a comparator, according to an example embodiment.

LSH leverages this insight by mapping each point to an LSH fingerprint by concatenating the outputs of k randomly chosen functions in family $\mathcal{H}$. Bit sampling may be replaced with multiplication a cacheline matrix 604 representing a cacheline by an LSH matrix 602 randomly sampled from a suitably constructed normal distribution to result in a cluster fingerprint matrix 606 representing the cluster fingerprint for that cacheline, as illustrated in FIG. 6A; such random projections preserve the distance between any two points to within a small error. By carefully selecting the LSH matrix 602, an arbitrarily high probability of finding a near neighbour within a chosen radius can be achieved.

The fingerprint obtained by applying the chosen subset of $\mathcal{H}$ and concatenating the results leads to a clustering scheme where all points with the same fingerprint are assigned to the same cluster. Relevant for cache compression, determining this fingerprint does not require preprocessing or queries of previously cached data.

At the same time, there are two challenges. One is that a cacheline may rarely be assigned to the "wrong" cluster, and be incompressible with respect to that cluster's clusteroid. Because this occurs very rarely, however, the effect on the overall compression ratio is negligible.

The other challenge is that cluster diameters vary across workloads, but combining LSH functions in a single fingerprint involves fixing the near-distance radius $r_1$. Again, correctness is not compromised because the "misclassified" lines can be stored uncompressed; in at least some embodiments, near-distance radius may be selected to keep those events rare and provide good compression.

To effect compression, a base block, or clusteroid, for each cluster is selected: the base block is stored uncompressed, and lines in the same cluster are encoded as differences with respect to this base block. Because a clustering scheme based on LSH treats all points in a cluster equally and does not identify a true centroid, in at least some embodiments the first cacheline to be inserted with a given LSH as the cluster base block.

FIG. 6B depicts a hardware-efficient LSH implementation according to at least some embodiments, which combines two separate refinements of the random projection. The first is that multiplication can be avoided by replacing the elements of the LSH matrix 602 with +1, 0, or −1, chosen at random with probabilities ⅙, ⅔, and ⅙, respectively, with negligible effects on accuracy. Indeed, the sparsity can be further improved by reducing the probabilities of non-zero values to d/log(d) (where d is the number of dimensions in the original space), again at negligible accuracy loss; this allows for very efficient hardware implementations.

To reduce the resulting LSH fingerprints from many bytes to a small number of bits, each component of the LSH fingerprint vector is replaced with 1 if it is positive or 0 if it is negative while retaining the chosen LSH probability bounds. Besides resulting in small fingerprints, this allows the fingerprint size to be selected at bit granularity by simply varying the number of hash functions used (i.e., number of LSH matrix rows).

More particularly, in FIG. 6B the cacheline matrix 604 is first multiplied by a sparse matrix 603 with entries from $\{-1,0,1\}$ to result in an intermediate vector product matrix 605; then, only the sign of each scalar in the intermediate vector product matrix 605 is retained, resulting in the cluster fingerprint matrix 606. FIG. 6C illustrates the hardware implementation using only adders in the form of adder trees 608 and comparators 610. In at least some embodiments, each cacheline in a cache may have its own one or more dedicated adder trees 608 and comparators 610 for determining the cluster fingerprint for that cacheline; in at least some other embodiments, multiple cachelines may share the same one or more adder trees 608 and comparators 610, or hardware may be customized to determine cluster fingerprints at a more granular level than a per cacheline basis.

Briefly, at least some example embodiments operate by applying the LSH hash as each memory block is inserted. When another "base" memory block with the same LSH exists, the incoming memory block is stored as a byte-level difference with respect to the base (if the difference is small enough to result in compression); if no other memory blocks share the LSH, the incoming memory block becomes the new base block for the cluster.

At least some embodiments herein use two primary data encodings: a compressed "base+diff" format in which data is stored as a difference (the "diff") relative to the base block (the "base"), and an uncompressed "raw" format used when compression is ineffective. Secondary data encodings are used for three common-case patterns: all-zero lines, base-only for lines that do not need a diff, and 0+diff for lines that do not need a base.

Figure 7:
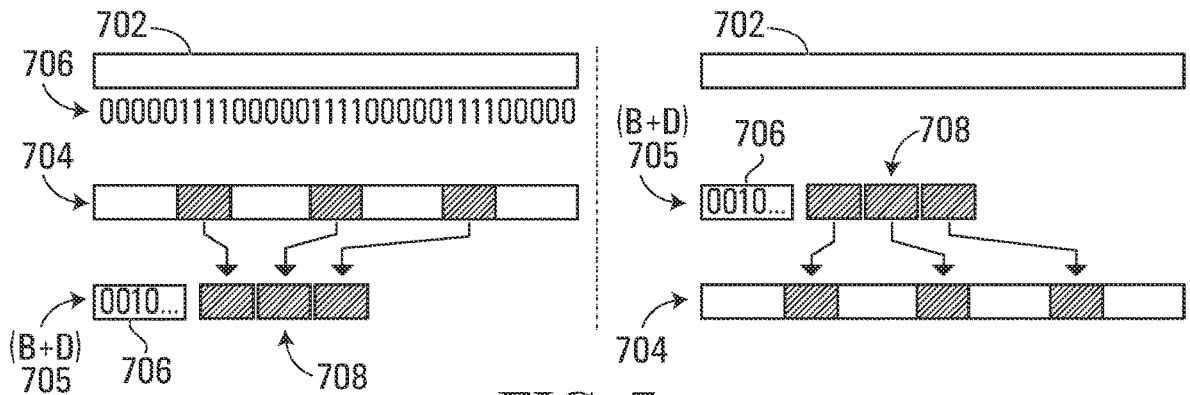
FIG. 7 depicts a BASE+DIFF compression encoding for compression, and a BASE+DIFF compression encoding for decompression, according to an example embodiment.

In the base+diff encoding, illustrated in FIG. 7, memory blocks within a cluster are represented as a compacted byte difference with respect to the base block 702 common to the entire cluster. FIG. 7 shows uncompressed data blocks 704 and compressed data blocks 705. The encoding consists of a 64-bit mask that identifies which bytes differ from the base (a "bitmask" 706), followed by a sequence of the bytes that differ (a "sequence of differing bits" 708). As shown on the left-hand side of FIG. 7, during compression, the uncompressed data block 704 is compressed into the compressed data block 705 by encoding the compressed data block 705 as the bitmask 706 and sequence of differing bits 708. Analogously, during decompression, the compressed data block 705 is decompressed to the uncompressed data block 704. More particularly, the "base" (the base block 702) and the compressed "diff" encoding are combined by replacing the relevant bytes using the bitmask 706 and the sequence of differing bits 708; this is shown on the right-hand side of FIG. 7. The sequence of differing bits 708 may be expressed in a variety of suitable ways; for example, it may be expressed as a sequence of differing bits, bytes, or words of any suitable bit-length.

Lines encoded as all-zero are identified as such in a tag entry 316, as discussed below, and require no additional storage. Similarly, base-only lines are equal to the cluster's base block 702, and so do not need a diff entry in the compressed data blocks 705 in the data array 310. Finally, 0+diff lines are encoded as a byte-difference from an all-zero cacheline, which may or may not be explicitly stored.

Figure 8:
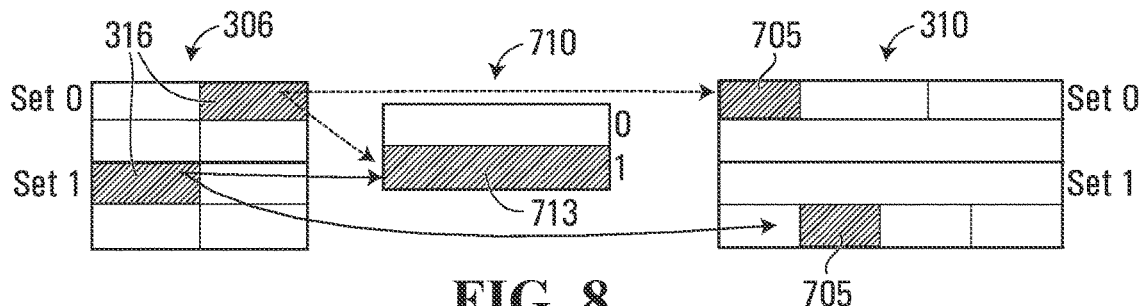
FIG. 8 depicts a two-set, two-way cache with two memory blocks cached in the BASE+DIFF format, according to an example embodiment.

FIG. 8 shows the storage structures used to implement a tag array 306, base cache 710, and data array 310, and the connections among them, according to at least some embodiments. More particularly, FIG. 8 shows a two-set, two-way cache with two memory blocks cached in the base+diff format as compressed data blocks 705. The entries share the same base block 702 but have different diffs. The tag array 306 and the data array 310 are decoupled to enable the storage of a larger number of tags 316 as compared to data entries. As discussed further below, the tag array 306 stores one or more fingerprints of base blocks used for data compression; while the tag array 306 comprises part of a cache implementation of at least some example embodiments, in at least some non-cache implementations the tag array 306 is replaced with an analogous fingerprint array that stores one or more fingerprints of the base blocks.

At least some embodiments store the base blocks 702 for each possible LSH fingerprint in main memory, and caches the most recently used base blocks 702 within a small LLC-side structure similar to a TLB, referred to herein as the base cache 710.

Figure 9:
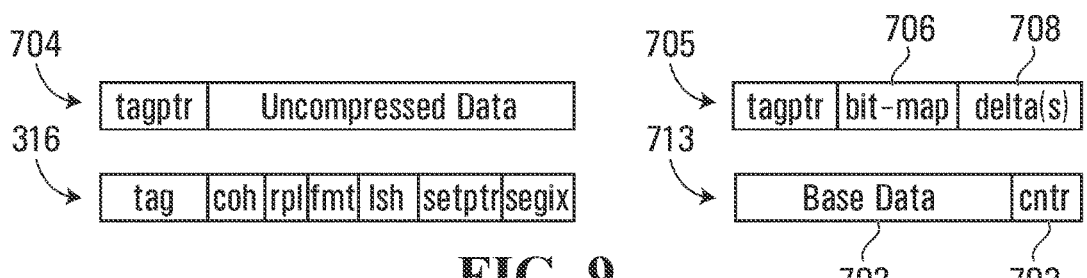
FIG. 9 depicts data array entries for uncompressed data (left), and data array entries for BASE+DIFF/0+DIFF encodings, according to an example embodiment.
Figure 10:
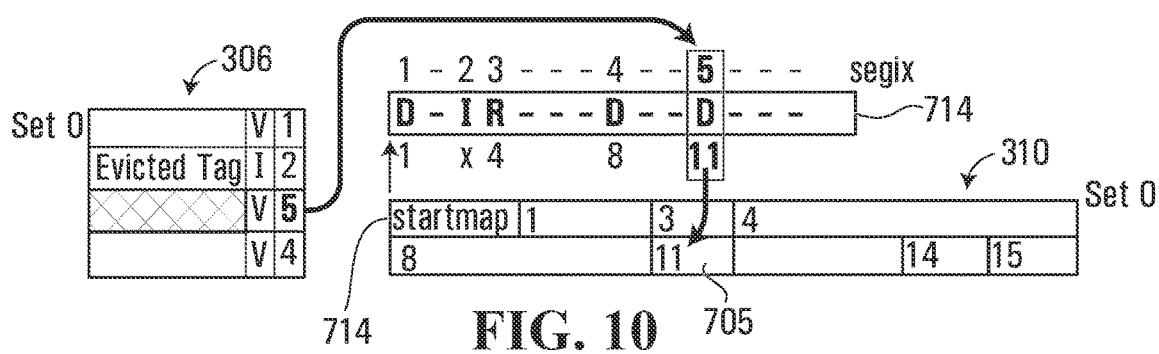
FIG. 10 depicts how a segment index and startmap are used to locate a compressed data block within a set, according to an example embodiment.

The tag array 306 is indexed by the physical address of the LLC request, and entries are formatted as shown in FIG. 9. In FIG. 9, data array entries are shown for uncompressed data (top left) in the form of the uncompressed data block 704, base+diff/zero+diff encodings (top right) in the form of the compressed data block 705, tag array entry 316 formats (bottom left), and base block 702 (i.e., base array entry) formats (bottom right). The tag, coh, and rpl fields respectively correspond to the tag, coherence state, and replacement policy state of the cache. The lsh field identifies the LSH fingerprint for the cached data, which points to the base block 702 for this LSH in the base array, as discussed further below. The setptr field points to a set in the data array 310, whereas the segix field is a segment index that identifies the segment within the set as discussed further below. Finally, the fnt field is a format that identifies the cacheline as an all-zero cacheline, a base+diff encoding, or an uncompressed raw cacheline.

FIG. 9 also shows that to store the clusteroid (base block 702) for each cluster fingerprint corresponding to a particular LSH, at least some embodiments use a global in-memory array allocated by the OS referred to as a base array. Each base array entry 713 comprises a base block 702 and a counter 703 of how many current cache entries are using this base block 702. When the counter 703 decreases to 0, the base block 702 associated with that counter 703 is replaced with the next incoming cacheline for that LSH, which allows the method and system of at least some example embodiments to adapt to changing working sets.

The data array 310 is organized in individually indexed sets 308. To facilitate the storage of variable-length compressed diffs, however, each set 308 is organized as a sequence of 8-byte segments: a single data array entry (i.e., a cacheline in base+diff or raw format) may take up anywhere from two to eight segments. To avoid intra-set fragmentation, segments in a set 308 are compacted on eviction.

As the data array 310 is decoupled from the tag array 306, any set in the data array 310 can store the incoming memory blocks. Therefore, each data array entry, regardless of whether the data block is compressed or uncompressed, contains a tagptr that identifies the corresponding tag array entry 316. This entry is used to evict the tag if the data array entry is removed to free space for an incoming memory block.

Each set also contains a map called the startmap 714. The startmap 714 helps identify which segments begin new entries in the data array 310; this enables intra-set compaction without the need to traverse the tag array 308 and modify the (possibly many) tag entries 316 to reflect new data locations. The startmap 714 has as many entries as there are segments in the data array 310, where each entry is one of valid-raw, valid-diff, or invalid (128 bits total).

The startmap 714 works in conjunction with the segix field in the tag array 306: segix identifies the ordinal index in the set (e.g., first, second, nth, etc.), while the startmap 714 identifies which entries are valid. The location of the nth entry is obtained by adding the sizes of the first n−1 valid-raw or valid-diff startmap entries. Because evicted entries can set their startmap tags to invalid without affecting the segix for the following entries, sets can be recompacted without updating the tag array. FIG. 8 depicts an example use of the startmap 714. In FIG. 8, the segment index having a value of 5 and the startmap 714 combine to locate the compressed data block 705 within the data array. The $2^{nd}$ entry in the startmap 714, labelled "I", is invalid, so it is skipped in the startmap 714. The remaining entries in the startmap 714 are labelled "D" (a valid entry that relies on the base+diff encoding) and "R" (a valid entry that is "raw", or uncompressed). Lines stored in the raw format (FIG. 9, top left) contain a 15-bit tag pointer followed by 64 bytes of data across eight contiguous segments. Lines in the base+diff format (FIG. 9, top right) also begin with a 15-bit tag pointer; this is followed by a 64-bit map in the form of a bitmask 706 that identifies which bytes differ from the base block 702, and then by a sequence of the differing bits 708.

For performance, the base array may be cached in a small, table-like structure near the LLC, referred to herein as the base cache; the base cache is in at least some embodiments a pseudo-LRU-managed, 64-set, 8-way set-associative structure. The entries in the base cache contain an entry in the form of the base block itself, an LSH tag, and replacement policy state.

While in the presently depicted embodiment the bitmask 706 and sequence of differing bits 708 is used to encode the compressed data block 705, in at least some different embodiments different types of encoding may be used. For example, more generally, the compressed data block 705 may be encoded as a difference between the uncompressed data block 704 and the base block 702. For example, this may comprise encoding the compressed data block 705 as an identifier that identifies which bits of the uncompressed data block 704 differ from the base block 702, and the sequence of differing bits 708. The bitmask 706 is one example of such an identifier; another example is a data array comprising indices (e.g., analogous to the startmap's 714 use of ordinal indices) identifying the bits of the uncompressed data block 704 that differ from the base block 702.

Examples

Figure 11A:
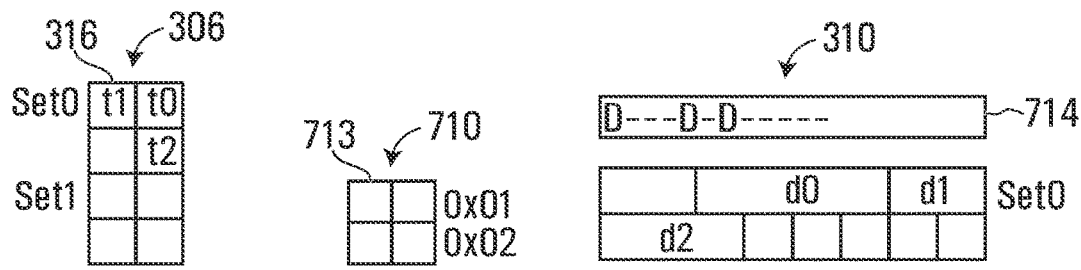
FIGS. 11A-D depict a cache in an initial state (FIG. 11A), a cache during read request processing (FIG. 11B), a cache during eviction (FIG. 11C), and a cache during new entry insertion (FIG. 11D), according to example embodiments.

FIGS. 11A-D depict various cache compression examples. FIG. 11A depicts an initial state of the cache comprising the tag array 306, base cache 710, and data array 310. The tag array 306 comprises sets 0 and 1, the data array 310 comprises the startmap 714 and compressed data blocks 705, labelled d0-d2. Each of these compressed data blocks 705 are stored in one or more segments of the data array 310.

Figure 11B:
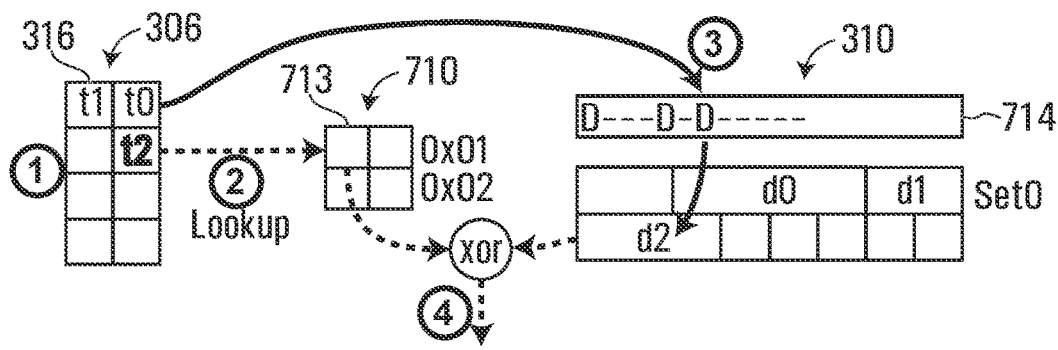

FIG. 11B depicts read request processing. The address is used to index the tag array 306 (labelled 1); in this example, the cacheline uses the base+diff encoding. The LSH stored in the tag entry 316 is used to index into the base cache 317 and retrieve the base block 702 (labelled 2). Concurrently, the set index from the tag entry 316 is used to retrieve the set. The segment index from the tag entry 316 and the startmap 714 from the data entry are combined to identify the beginning of the encoded cacheline in the set (labelled 3). The bitmask 706 and sequence of differing bits 708 represented as bytes stored in the diff entry are used to replace the corresponding bytes from the base block 702, and the resulting line is returned (labelled 4).

Figure 11C:
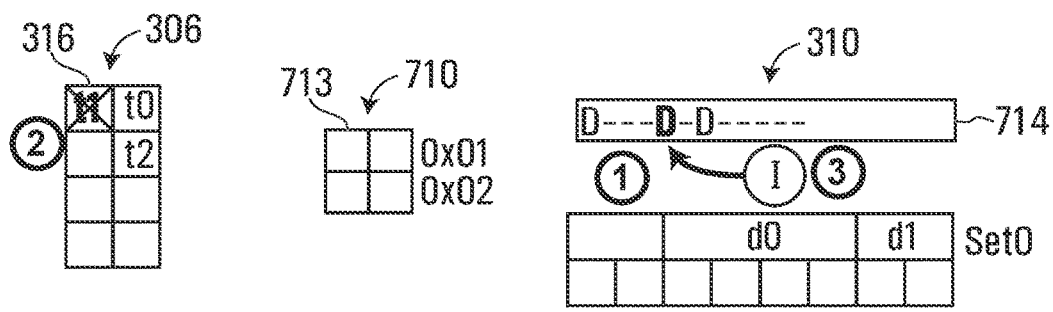

FIG. 11C illustrates how the startmap 714 is updated during an eviction from the cache, showing a set before and after evicting entry d1. Before the eviction, d1 is the second valid index in the startmap 714 (labelled 1), d2 is the third, and so on. After the eviction, the tag array entry 316 for d1 has been invalidated (labelled 2), the other entries (d0, d2) have been compacted to form a contiguous set, and the startmap entry that previously identified d1 has become invalid (labelled 3). This means that d2 is still the third overall entry in the startmap 714, and the tag array entries for d2 do not need to be updated to reflect the compaction.

Figure 11D:
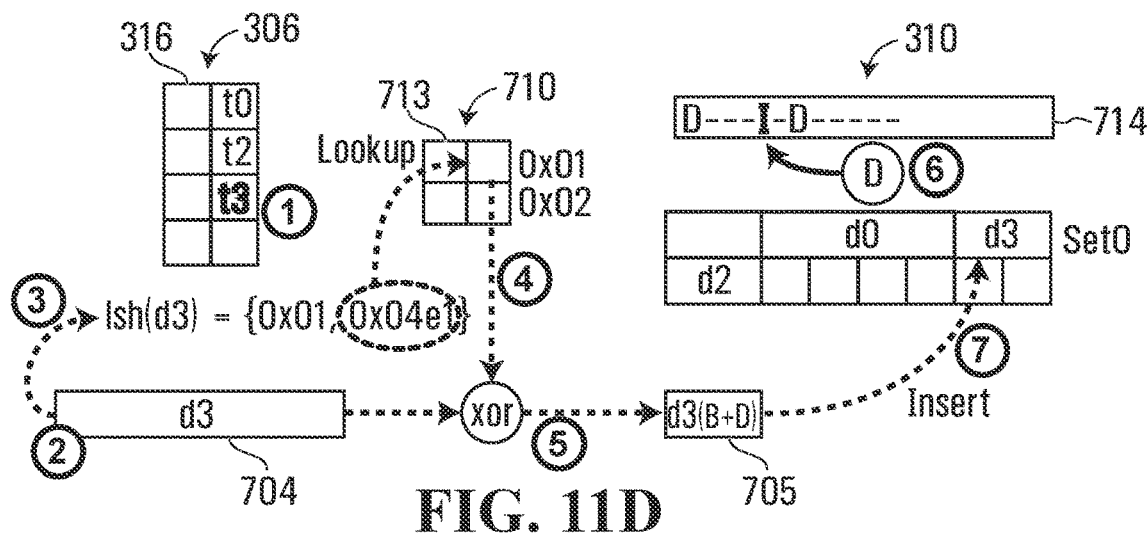

FIG. 11D depicts insertion of a new uncompressed data block 704 in the form of entry d3 into the cache. First, the access misses in the tag array 306 and a request is made to the backing memory (labelled 1). When the cacheline data arrives, it is returned to the requesting cache (e.g., L2) (labelled 2). In parallel, the cacheline's LSH fingerprint is computed (labelled 3) and used to index the base cache 710. In this example embodiment, d3 represents the entire cacheline, and consequently the LSH fingerprint for the entire cacheline is determined; in at least some different embodiments, the fingerprint for part of a cacheline or more than one cacheline may be determined. In this example this access hits and returns the data for the base block 702 (labelled 4). New entry d3 is then xor'd with the base block 702, and the non-zero bytes of the resulting difference are encoded as a bitmask 706 and a sequence of differing bits 708 (labelled 5); in the example, this encoding takes up 16 bytes, or two segments. Next, this entry is inserted in the cacheline from the previous example containing d0, d2, and d3: the validity field invalid startmap entry is replaced by valid-diff (labelled 6), and the entry in the form of the compressed data block 705 is inserted in the corresponding sequence in the data array 310 (labelled 7).

Operational Details

Figure 12:
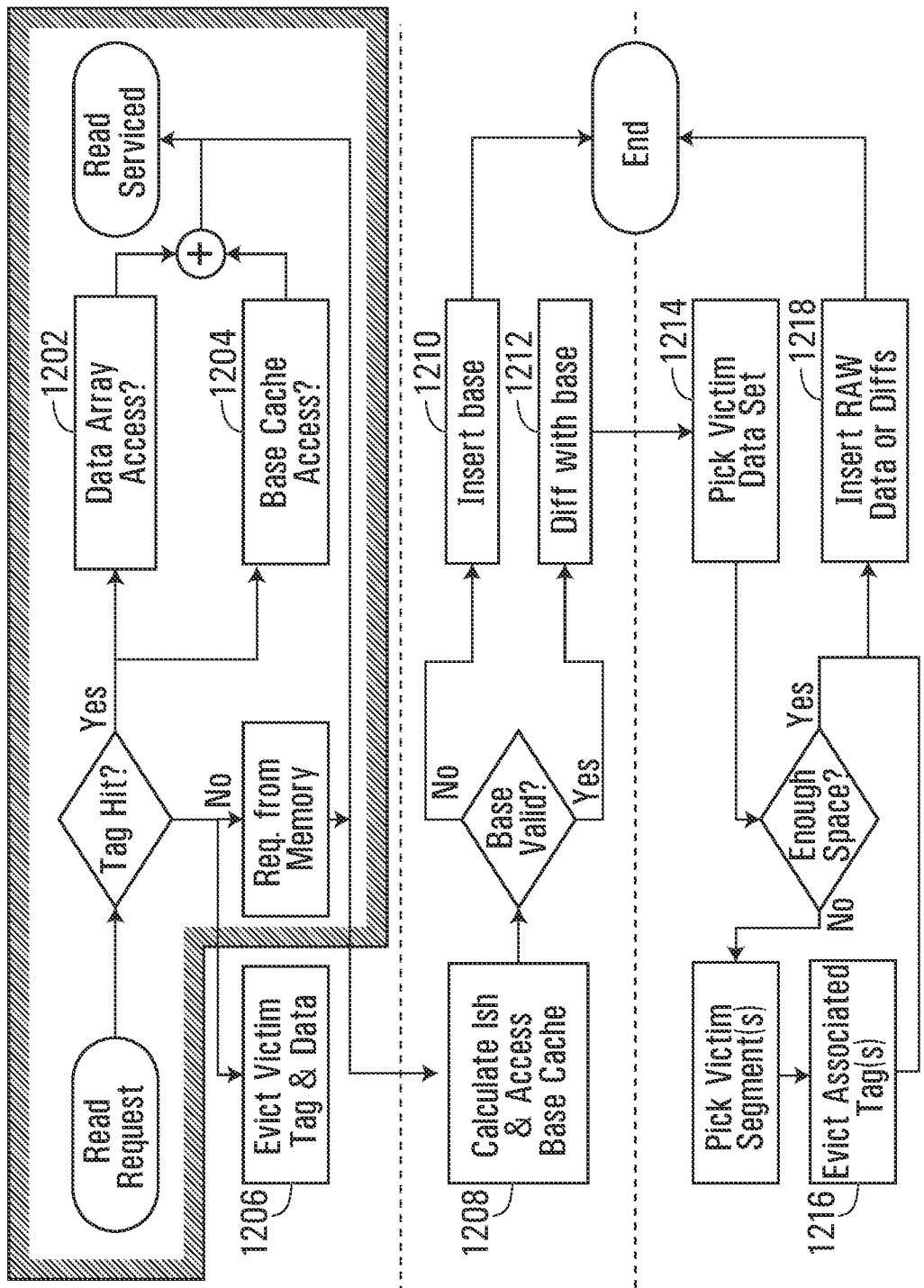
FIG. 12 is a flowchart depicting a read request, according to an example embodiment.

FIG. 12 depicts a flowchart showing how a read request is serviced, according to at least some example embodiments. Shaded areas are on the critical path, while unshaded areas are performed in parallel with servicing the read request. More particularly, FIG. 12 is delineated by dashed lines into top, middle, and bottom portions: the top portion of FIG. 12 depicts the critical-path lookup sequence; the middle portion depicts cluster fingerprint computation for new data brought in by a miss; and the bottom portion depicts insertion of new data and possible data array evictions.

When the request is received, the address is looked up in the tag array. If the tag hits, the setptr is used to index the data array (block 1202) (for 0+diff and base+diff formats) and, in parallel, the lsh indexes the base cache (block 1204) (for base-only and base+diff formats). If the base block corresponding to the LSH, which is the cluster fingerprint for this embodiment, represented by the lsh index is not in the base cache, an access is made to the memory to retrieve the base block for that LSH (not shown).

If the tag misses, a request is made to the backing memory (block 1206); meanwhile, the victim tag and its corresponding data array entry are evicted and the new tag is inserted. The data is returned to the requesting cache as soon as it arrives; inserting the new line in the cache happens off the critical path as other read requests are handled.

If the newly arrived line consists of zeros, an all-zero tag is inserted and processing ends. Otherwise, the LSH for the newly arrived line is computed (block 1208), and used to index the base cache; if the LSH is not in the base cache, the data is inserted uncompressed (in raw format) while the base block is retrieved from the base array in memory (not shown). If there is currently no base block corresponding to the LSH, the new line is installed as the base block and processing ends (block 1210) by inserting a base-only tag entry. Otherwise, the byte-difference with respect to the base block is calculated (block 1212); if there are no differences, a base-only tag is inserted and no entries in the data array are made.

For non-base entries, the diff is packed together with a bitmask in the base+diff or 0+diff format; if compression is not possible, the entry in the data array uses the raw format. In either case, the appropriate tag is inserted, and a data block is added to the data array. To make space, a data array victim set is selected (block 1214) as described below; if there is not enough space there, enough victim segments are selected to make space for the new block, and their tags evicted (block 1216). Finally, the block is inserted in the data array, and in some embodiments the set is recompacted (block 1218).

Accesses that modify a block in the data array can change the mode of compression or the size of the compressed block. If the diff is smaller, the data array entry is either removed (for all-zero or base-only) or the block's bitmap is updated and the set is compacted. If the diff is larger, other entries are evicted from the set to make space (labelled 8), and the set is updated and compacted.

For write operations in memory models without write acknowledgements (most extant ISAs), the entire write is performed off the critical path. For atomic read-modify-write operations (e.g., compare-and-swap), the read part is serviced as soon as possible, and the write part is completed off the critical path.

In at least some embodiments, the tag array follows a suitable replacement policy, such as pseudo-LRU; the base cache follows pseudo-LRU. Unlike in a conventional cache, however, the data array entry applies a separate replacement policy: for example, the data array may apply a replacement policy that favours evicting fewer data entries over recency, as not-recently-used data array entries will have been evicted anyway by the tag array replacement policy.

Also in at least some embodiments, to choose a victim set, a best-of-n replacement policy is applied. First, four sets are randomly selected. If one of the sets has enough free segments to store the incoming (possibly compressed) block, it is chosen and no evictions are made; otherwise, the set with the fewest segments that would have to be evicted to make enough space is selected.

Randomness makes it improbable that frequently used blocks do not evict each other in a pathological pattern: if a block is evicted and soon thereafter reinserted, it will likely end up in a different set than the block that evicted it.

Figure 21:
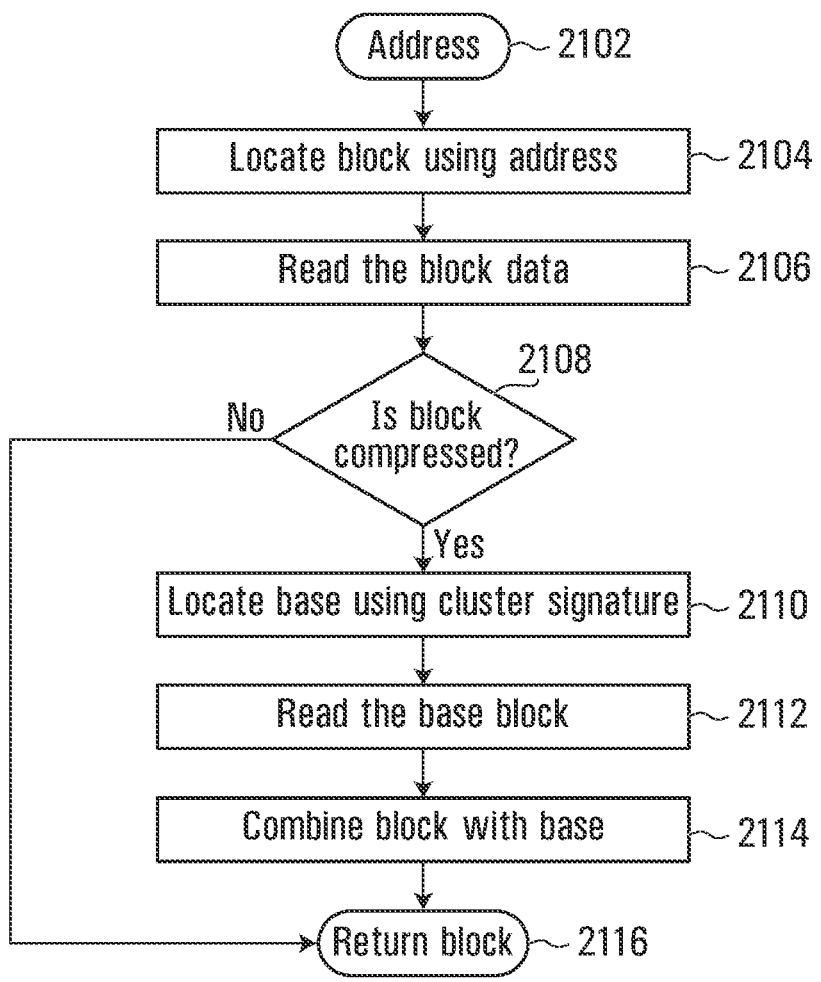
FIG. 21 is a flowchart depicting accessing a data block from a cache, according to an example embodiment.
Figure 22:
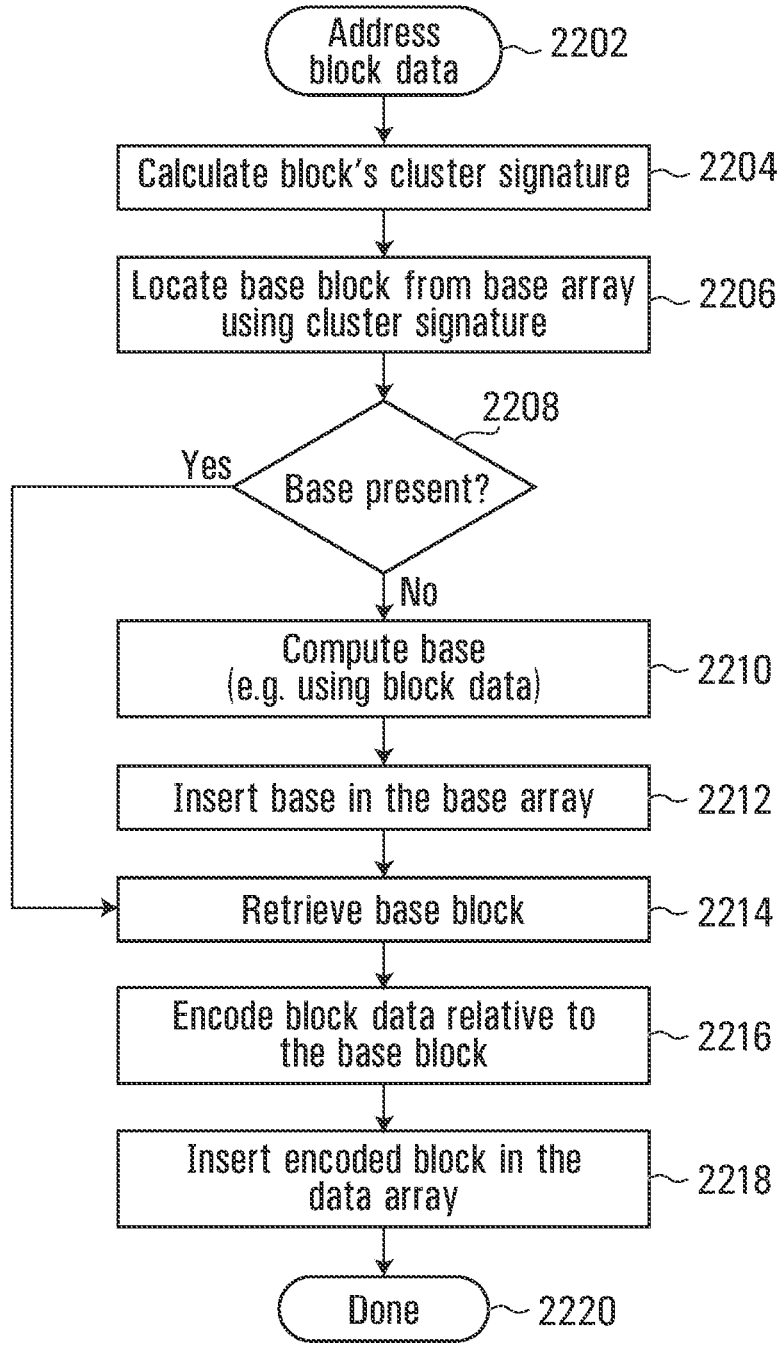
FIG. 22 is a flowchart depicting inserting a data block into a cache, according to an example embodiment.

FIGS. 21 and 22 depict additional operational examples, according to additional example embodiments. More particularly, FIG. 21 is a flowchart depicting operations performed during an insertion phase, in which blocks are added to a data array; and FIG. 22 is a flowchart depicting operations performed during an access stage, when a block stored in the data array is retrieved.

Accessing stored data occurs in several steps, shown in FIG. 21. First, the address (block 2102) is used to locate the data within the compressed data array, uncompressed data array, or both (block 2104). The block is then retrieved (block 2106) and the encoding is examined to determine whether the block is compressed on uncompressed (block 2108). Uncompressed blocks are directly returned to service the access request (block 2116). Compressed blocks' encodings contain the cluster fingerprint, which is used to locate (block 2110) and retrieve (block 2112) the base block for the cluster. The differences encoded in the compressed block retrieved in block 2106 are then applied to the base block retrieved in block 2112, resulting in the decompressed block (block 2114), which is then returned to service the access request (block 2116).

Inserting data into the storage structure is shown in FIG. 22, and starts with providing the address and the data contents of the new data block (block 2202). First, the block's cluster fingerprint is determined (block 2204), and used to locate the cluster's base block within the base array (block 2206). If the base is not present in the base array (block 2208), the base block is constructed (block 2210) and inserted in the base array (block 2212); if the base block is present in the base array (block 2208), blocks 2210 and 2212 are skipped. Next, the base block is retrieved (block 2214), and the incoming new data block is encoded as a difference between the block data and the base block (block 2216) (this encoding may be the original block, if smaller than the base-relative encoding). Finally, the newly encoded block is inserted in either the compressed data array or the uncompressed data array, as appropriate (block 2218) following which the method ends (block 2220).

Some embodiments support evicting blocks from the data array. In at least some embodiments in which the base array is separate from the data arrays, blocks stored in the compressed and uncompressed data arrays are simply removed. In embodiments in which base blocks are also stored in the data arrays, the base block is not removed if any existing data blocks are encoded using that base block; this may be accomplished, for example, by keeping a reference count together with the base blocks and only allowing eviction when the count reaches zero. As described above, for instance, the base array may be stored separately in the system's main memory (e.g., DRAM), and a small cache (the base cache) may be used to accelerate access to the base array.

As discussed above, at least some embodiments that support modification of a stored block in the data array follow the operations for evicting the stored block followed by operations for inserting a modified version of the block.

As described above, the foregoing embodiments do not rely on prior compressed blocks (which may have been evicted from the hardware cache), and accordingly uses a base array comprising reference "bases" that is used to decompress a retrieved compressed cache line. For example, the base array is in some embodiments initialized with specific values (e.g. random) and those values are used as base blocks without them having ever been seen in the access stream as a new data block.

Evaluation

To evaluate effects on cache behaviour and performance, an example embodiment and the comparison baselines were implemented in the microarchitecture-level simulator ZSim (see D. Sanchez and C. Kozyrakis, 2013, ZSim: Fast and Accurate Microarchitectural Simulation of Thousand-core Systems in ISCA 2013). An out-of-order x86 core similar to an i5-750 was simulated, modelling on- and off-critical-path events as well as limited interconnect bandwidths; the simulated system was:

| | |
|---|---|
| CPU | x86-64, 2.6 GHz, 4-wide OoO, 80-entry ROB |
| L1I | 32 KB, 4-way, 3-cycle access lat., 64 B lines, LRU |
| L1D | 32 KB, 8-way, 4-cycle access lat., 64 B lines, LRU |
| L2 | Private, 256 KB, 8-way, 11-cycle lat., 64 B lines, LRU |
| LLC | Shared 1 MB, 8-way, 39-cycles lat., 64 B lines, 8 banks |
| Memory | DDR3-1066, 1 GB |

Compression was applied at the LLC level only.

To estimate silicon area and power impacts, all logic that is used in an example embodiment and not in a conventional cache was implemented in Verilog RTL, and synthesized with Synopsys Design Compiler tool using the FreePDK45 standard cell library. CACTI 6.5 was used to estimate the area, access time, and power of storage structures.

As the baseline, a conventional (uncompressed) LLC with 1 MB capacity per core was modelled; a hypothetical LLC with 2×the capacity (2 MB), which has an effective capacity similar to a 1 MB cache according to an example embodiment, was also modelled. To study relative improvements over prior intra- and inter-cacheline compression, BΔI and Dedup were also implemented. All compressed configurations (an example embodiment, Dedup, and BΔI) were sized to occupy the same silicon area as the baseline LLC (1 MB conventional cache with a 48-bit address space): the following table compares the storage allocations. The Dict. category accounts for the hash array required by Dedup and the base cache used by at least some example embodiments.

| | | Conv. | BΔI | Dedup | Example Embodiment |
|---|---|---|---|---|---|
| Tag | #Entries | 16384 | 32768 | 32768 | 32768 |
| | Entry Size | 37 b | 47 b | 81 b | 72 b |
| | Total Size | 74 KB | 188 KB | 324 KB | 288 KB |
| Data | #Entries | 16384 | 14336 | 11700 | 11700 |
| | Entry Size | 512 b | 512 + 0 b | 512 + 16 b | 512 + 32 b |
| | Total Size | 1024 KB | 896 KB | 754 KB | 777 KB |
| Dict. | #Entries | — | — | 8192 | 512 |
| | Entry Size | — | — | 24 b | 24 + 512 b |
| | Total Size | — | — | 24 KB | 33 KB |
| | Total Size | 1.07 MB | 1.06 MB | 1.07 MB | 1.07 MB |

To find a suitable LSH size, sizes of 8-24 bits were swept. 12-bit LSHs were found to result in good compression for most workloads while keeping the base array size low.

All designs were evaluated on the SPEC CPU 2017 suite. For each benchmark, the first 100B instructions were skipped, and the last 20% of each 1B instructions were executed. For miss rate and speedup measurements, the benchmarks were split into cache-sensitive (S) and cache-insensitive (NS). In the evaluation, a benchmark was considered cache-sensitive if doubling the cache size to 2 MB improved the MPKI by more than 10%. In at least some example embodiments, the LLC dynamically detects cache-insensitive workloads by measuring average memory access times and disables LLC compression.

Figure 13A:
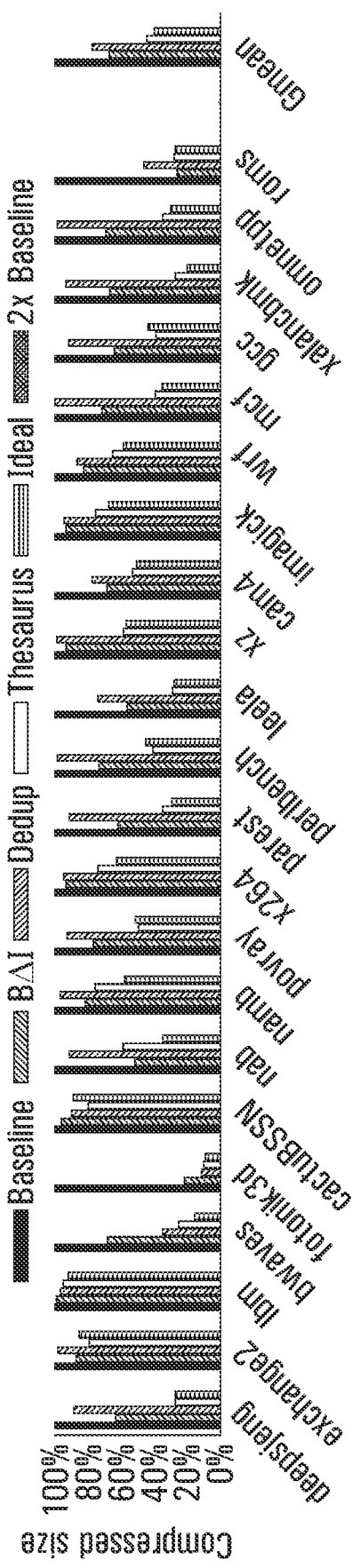
FIGS. 13A-C depict compressed working set size (FIG. 13A), cache miss rates (FIG. 13B), and performance improvements (FIG. 13C) of at least some example embodiments compared to a baseline (uncompressed) cache, iso-silicon BAI (intra-block) and Dedup (inter-block), Ideal-Diff, and an uncompressed cache with 2× capacity, according to example embodiments.
Figure 13B:
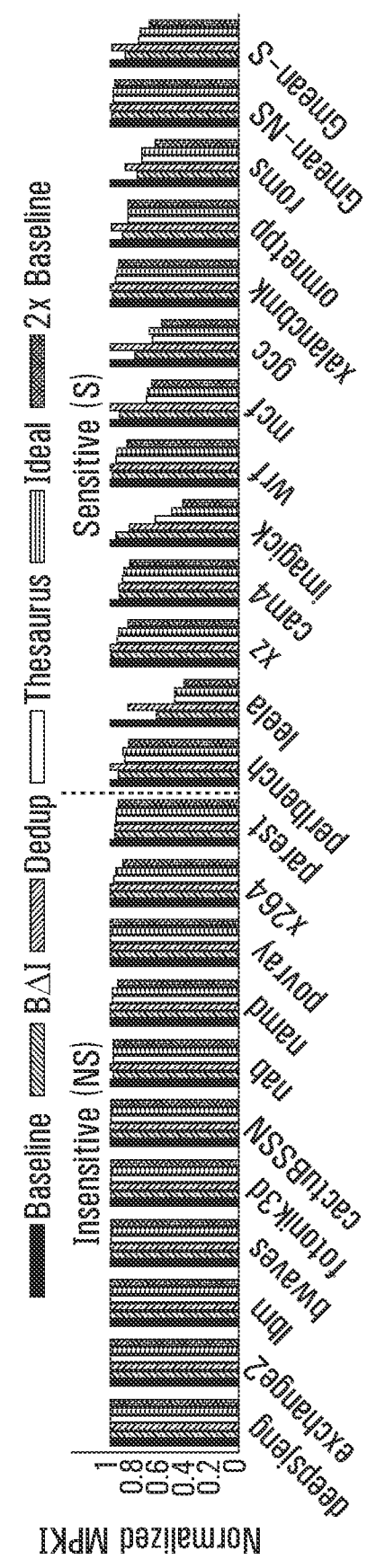
Figure 13C:
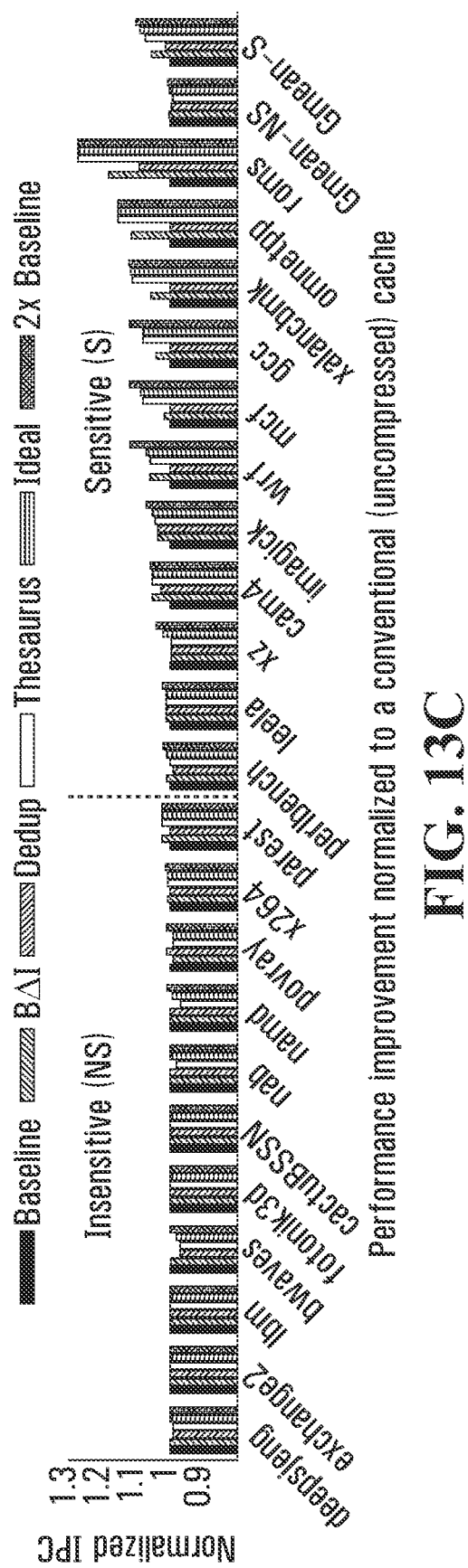

FIGS. 13A-C show the improvements over the uncompressed baseline and conventional compressed caches. FIGS. 13A-C also compare against a theoretically ideal clustering method that searches the entire cache for the nearest match and diffs against it in one cycle and a conventional cache with twice the capacity.

FIG. 13A shows the effective cache footprint reduction—i.e., the data array space taken up by the cached addresses normalized to the equivalent space that would have been required to hold the same addresses in a conventional cache. Overall, the presently described embodiment compresses the working sets by 2.25×, compared to 1.28× for exact deduplication and 1.48× for BΔI compression (all geomeans); this demonstrates that the presently described embodiment compresses more effectively than conventional cache compression techniques.

The LSH scheme in the presently described embodiment also captures nearly all data that can be effectively clustered: the cache footprint obtained using the presently described embodiment is within 5% of the ideal clustering scheme, which searches the entire cache for the nearest match. In a few cases, compression is, in fact, slightly better (e.g., povray, perlbench, gcc): this is because the presently described embodiment can diff against a clusteroid whose tag has since been evicted from the cache, while the ideal clustering model is restricted to currently cached entries.

FIG. 13B shows that the presently described embodiment substantially reduces miss rates: for the cache-sensitive subset of the suite, MPKI drops to 0.78 of the conventional cache compared to 0.98 for exact deduplication and 0.89 for BΔI (all geomeans). The presently described embodiment is also within 1.5% of the ideal clustering model, and within 8% of the MPKI that can be attained with a conventional cache with 2×capacity. This is because, thanks to the effective compression, more data can be cached within the same silicon area, which benefits cache-sensitive workloads.

Finally, FIG. 13C shows that the reduced MPKI rates result in execution time speedups over the baseline as well as Dedup and BΔI. The presently described embodiment is up to 27.2% faster than the conventional baseline (7.9% geomean), and up to 9.1% faster than BΔI (5.4% geomean). Indeed, performance is within 1.1% of the ideal clustering model, and within 2.2% of a conventional cache with 2×capacity.

CACTI 6.5 is used to estimate the read energy and leakage power of all cache structures; the results are shown in the following table. The table shows dynamic read energy and leakage power per bank of compressed and conventional caches scaled to the same silicon area (1 MB uncompressed=5.56 mm$^2$ in 45 nm or 2.82 mm$^2$ in 32 nm).

|  | 45 nm | | 32 nm | |
| --- | --- | --- | --- | --- |
|  | dynamic energy | leakage power | dynamic energy | leakage power |
| Conv. | 0.50 nJ | 205.47 mW | 0.28 nJ | 109.96 mW |
| BΔI | 0.55 nJ | 196.47 mW | 0.31 nJ | 105.22 mW |
| Dedup | 0.56 nJ | 226.33 mW | 0.32 nJ | 121.06 mW |
| Example Embodiment | 0.56 nJ | 236.01 mW | 0.31 nJ | 125.85 mW |
| Conv. 2x | 0.78 nJ | 349.21 mW | 0.44 nJ | 186.50 mW |

While the presently described embodiment uses ~12% more energy for each read and has a ~14% leakage power overhead, these overheads are significantly lower than ~57% increase in dynamic energy and ~70% increase in leakage power for a conventional cache with the same effective capacity.

The overhead of the presently described embodiment (~0.06 nJ per access at the 45 nm node) is trivial compared to the energy of accessing external DRAM (32.61 nJ using the same CACTI model). This means that the presently described embodiment can actually save energy when the entire memory hierarchy is considered. In order to measure this, the total added power of the compressed cache (30.54 mW+6.4 mW+0.06 nJ×access rate) is calculated and total power saved by accessing off-chip DRAM less frequently (32.61 nJ×access rate difference between the presently described embodiment and uncompressed).

Figure 14:
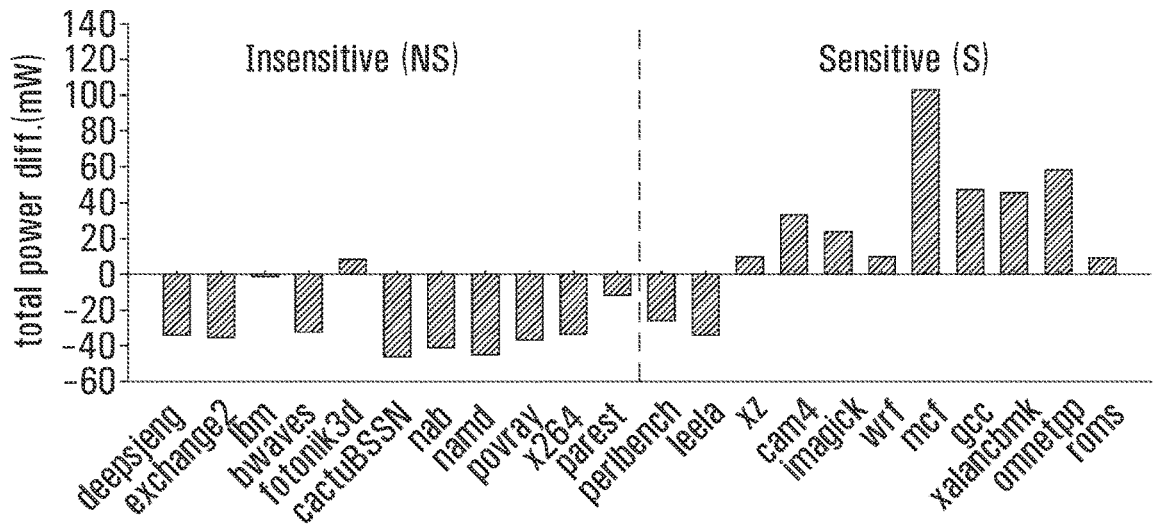
FIG. 14 depicts a difference in total power consumption using an example embodiment compared to a baseline.

While the power consumption of the LLC when used in conjunction with the presently described embodiment increases (from 36.87 mW to 51.28 mW) because of the added logic and more data array reads (due to the higher LLC hit rate), accounting for DRAM accesses results in power consumption savings of up to 101 mW in the cache sensitive benchmarks. Cache-insensitive benchmarks do not see fewer off-chip DRAM accesses despite effective compression, and therefore power overheads are not outweighed by power savings; however, a practical implementation would detect cache-insensitive workloads and simply disable compression for cachelines they access. FIG. 14 shows the difference in total power consumption using the presently described embodiment compared to the baseline, with positive values indicating less power consumption and negative values showing additional power consumption.

To measure latency, access times to each LLC structure were modelled using CACTI; because compressed caches have smaller data array sizes, overall access time is slightly reduced (~2% for the presently described embodiment). To measure compression and decompression latencies, the logic for compression, decompression, as well as locating and reading the compressed cachelines was implemented in 45 nm ASIC; the results are shown in the synthesis results of the following table. In the following table, segix refers to locating the compressed block within a set (decoding the indirect segix format) while multi-bank refers to the muxing used to access lines across multiple banks. 64-byte cachelines were used. Latency is in units of CPU cycles at the 2.66 GHz frequency of the equivalent 45 nm i5-750 core. The results were obtained using Synopsys DC and the 45 nm FreePDK.

|  | latency | dynamic power | leakage power | area |
| --- | --- | --- | --- | --- |
| comp. | 1 cycle | 0.116 mW | 2.44 mW | 0.016 mm$^2$ |
| decomp. | 1 cycle | 0.084 mW | 1.74 mW | 0.013 mm$^2$ |
| segix | 4 cycles | 0.035 mW | 0.49 mW | 0.007 mm$^2$ |
| multi-bank | — | 0.101 mW | 1.42 mW | 0.025 mm$^2$ |

At the relevant CPU frequency (2.66 GHz), compression and decompression take one cycle each, while locating the compressed data block in the set, described above, takes four more cycles. This brings the total decompression latency to 5 cycles, which was used for the performance simulations.

In respect of area used for implementation, the logic required for the presently described embodiment incurs an area overhead of 0.06 mm$^2$ in 45 nm: this includes the compression (0.016 mm$^2$) and decompression (0.013 mm$^2$), the logic to locate the segments in the set using the indirect segix encoding (0.007 mm$^2$), and the additional muxing used to read a set across multiple banks (0.025 mm$^2$). This is equivalent to 1% of the silicon area required for even a 1 MB cache, and a tiny fraction of a 4-core i5-750 in the same 45 nm node (296 mm$^2$).

To compare with prior compressed caches, we also implemented and synthesized the BΔI scheme, which at 0.037 mm² (20 k NAND gates) is slightly smaller than the presently described embodiment (0.06 mm² or 32 k NAND gates); this reflects BΔI offering much less compression. Various other NAND-gate estimates (see X. Chen, L. Yang, R. P. Dick, L. Shang, and H. Lekatsas, 2010, C-Pack: A High-Performance Microprocessor Cache Compression Algorithm, *IEEE Transactions on VLSI* 18 (2010), pp. 1196-1208 and P. A. Tsai and D. Sanchez, 2019, Compress Objects, Not Cache Lines: An Object-Based Compressed Memory Hierarchy in ASPLOS 2019) were used to compare against other prior compression schemes, all of which incur more area overhead than the presently described embodiment: C-PACK (see X. Chen, L. Yang, R. P. Dick, L. Shang, and H. Lekatsas, 2010, C-Pack: A High-Performance Microprocessor Cache Compression Algorithm, *IEEE Transactions on VLSI* 18 (2010), pp. 1196-1208) needs 0.075 mm² in 45 nm (40 k NAND gates) and FPC (see A. Alameldeen and D. Wood, 2004, *Frequent pattern compression: A significance-based compression scheme for L2 caches*, Technical Report, University of Wisconsin-Madison Department of Computer Sciences) needs 0.544 mm² (290 k NAND gates) just for decompression (see X. Chen, L. Yang, R. P. Dick, L. Shang, and H. Lekatsas, 2010, C-Pack: A High-Performance Microprocessor Cache Compression Algorithm, *IEEE Transactions on VLSI* 18 (2010), pp. 1196-1208), while BPC (see J. Kim, M. Sullivan, E. Chouske, and M. Erez, 2016, Bit-plane Compression: Transforming Data for Better Compression in Many-core Architectures in ISCA 2016) needs 0.127 mm² (68 k NAND gates).

Figure 15:
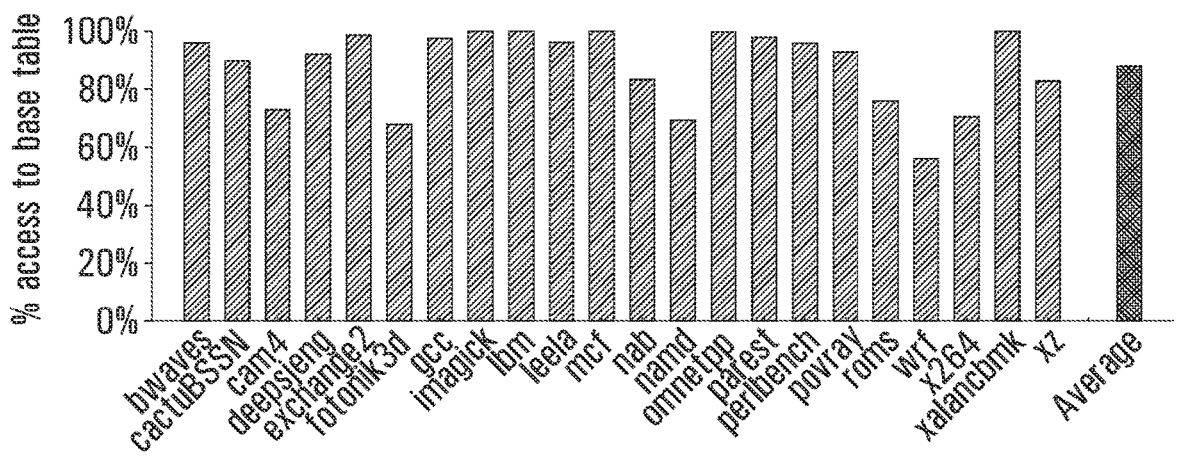
FIG. 15 depicts a fraction of cache insertions that are potentially compressible with respect to their clusteroid, according to an example embodiment.

To investigate the effectiveness of cacheline clustering based on locality-sensitive hashing, an examination of how many cache insertions are, in fact, compressed is performed. FIG. 15 shows a fraction of cache insertions that are potentially compressible with respect to their base block (an average of 87%). This shows that a significant majority of cache insertions can potentially result in compression—i.e., their differences versus the relevant base block are small enough that encoding them would take <64 bytes even with the overhead of the difference bitmask. This observation validates both the choice of LSH for clustering and the effectiveness of the above-described base block selection strategy to increase compressibility.

Figure 16:
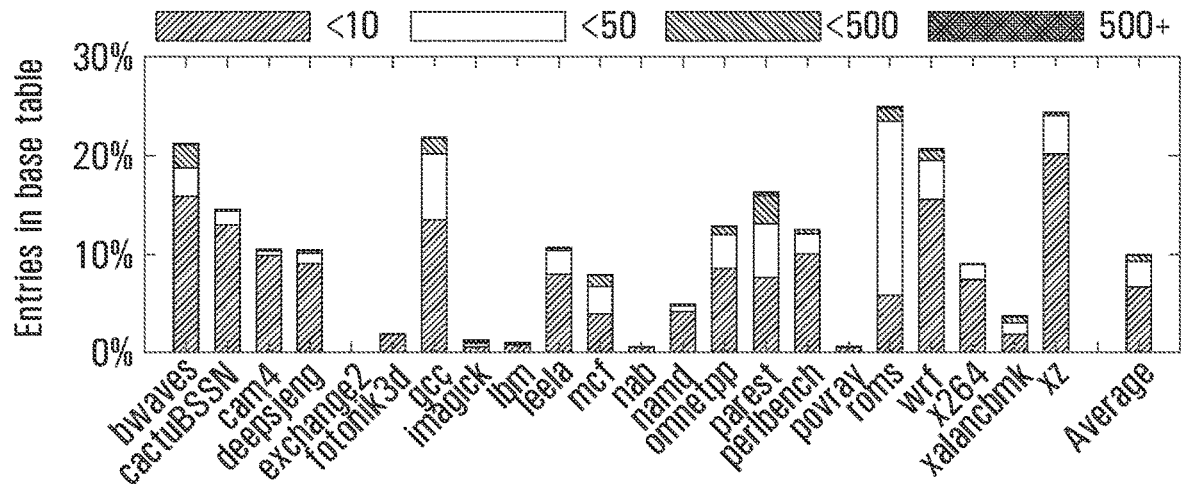
FIG. 16 depicts a distribution of clusters having the same locality-sensitive hash with different sizes, according to an example embodiment.

FIG. 16 graphs distribution of clusters (=same LSH, or cluster fingerprint) with different sizes (average over the runtime of each benchmark). FIG. 16 shows that most working sets have many small clusters rather than a few large clusters. Nevertheless, because the presently described embodiment tracks clusteroids for many LSH fingerprints, effective compression can still be obtained.

Figure 17:
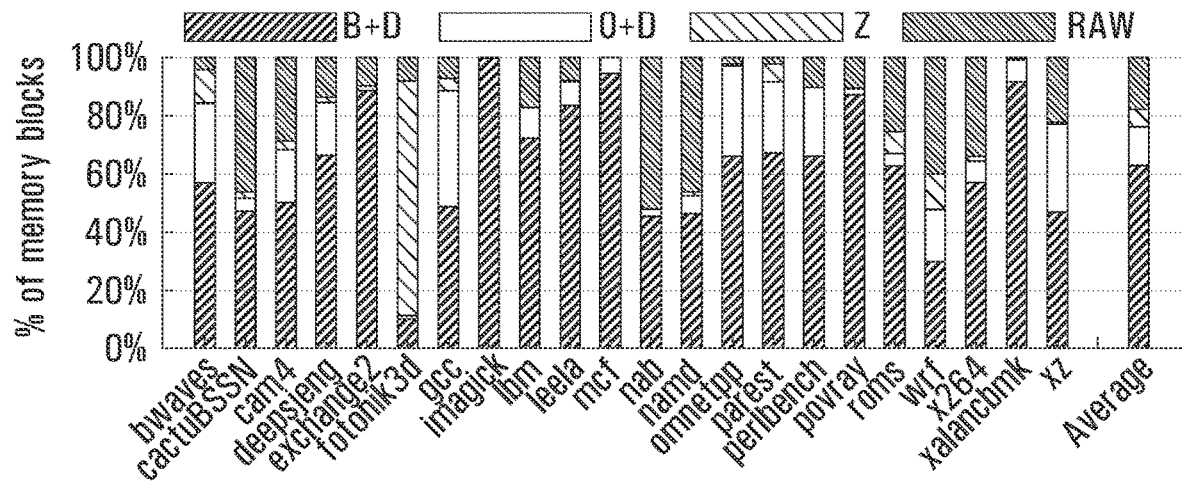
FIG. 17 depicts a frequency of different compression encodings in compressing benchmarks from SPEC, according to an example embodiment.

In respect of the compression encodings used by the presently described embodiment, FIG. 17 graphs the frequency of different compression encodings in compressing benchmarks from SPEC, where B+D=base+diff, 0+D=0+diff, RAW=uncompressed, and Z=all–zero. FIG. 17 shows that different workloads tend to benefit from different encodings. For most of the benchmarks, the byte-difference-based encodings are the most effective: the base+diff encoding covers an average of 76.2% of LLC insertions, while 0+diff covers a further 13.2%. Another 6.1% are covered by the all-zero encoding. Finally, 17.7% of LLC insertions are left uncompressed as the diff from the clusteroid (base block) is too large.

Figure 18:
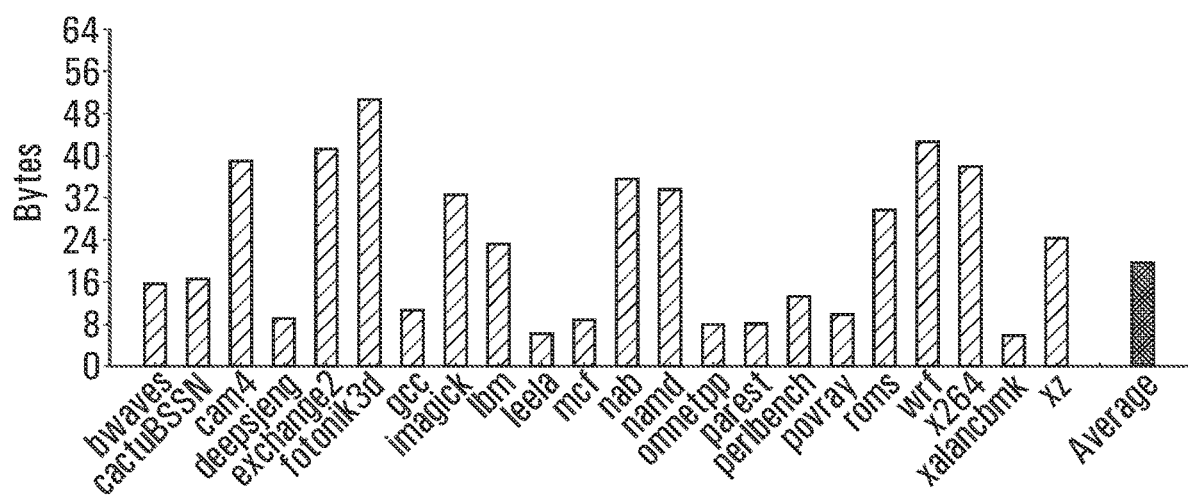
FIG. 18 depicts an average size of a byte different from the relevant clusteroid for BASE+DIFF and 0+DIFF, in number of bytes, according to an example embodiment.

FIG. 18 shows average size of the byte difference from the relevant clusteroid for base+diff and 0+diff, in number of bytes. In most cases, the differences tend to be small, with a quarter of the benchmarks averaging about 8 bytes or less, and half of the benchmarks averaging about 16 bytes or less.

This confirms that, for many benchmarks, caches have relatively tight data clusters with very small intra-cluster differences even at cacheline granularity.

Figure 19:
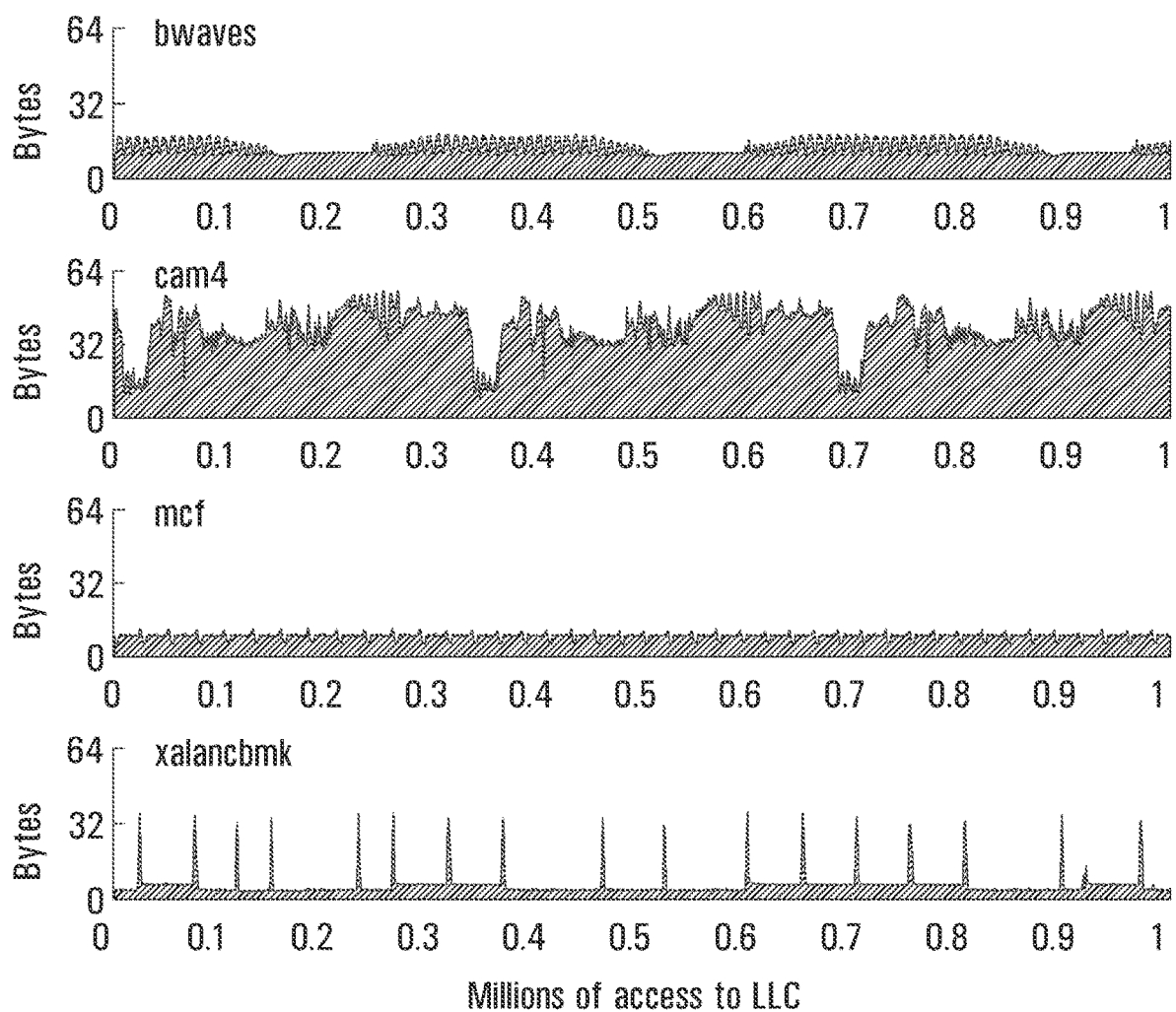
FIG. 19 depicts how the diff size varies over time, according to various example embodiments.

In fact, diff sizes can change significantly over the run time of even a single workload. FIG. 19 shows the diff sizes for 1 million cache insertions after the first 100 billion instructions (after skipping the first 40 billion instructions) for four workloads. In mcf, the data compression ratios are relatively stable; in xalancbmk, the tiny diffs of most accesses are punctuated by rare spikes of 32-byte diffs; bwaves has two distinct but small diff sizes; finally, cam4 intersperses blocks that offer little compression with periodic short bursts of compressible data.

Together with the number of insertions that can be compressed (see FIG. 15), the diff sizes explain the compression ratios for each benchmark. For example, more than 90% of inserted blocks in imagick can be compressed, but the average diff size is 32.6 bytes, resulting in a compression ratio of 1.3×(see FIG. 13). In contrast, xalancbmk and mcf combine a high (>90%) proportion of compressible insertions with a small average diff size (6 and 9 bytes, respectively), for a total compression factors of 2.6× and 3.7×.

Figure 20:
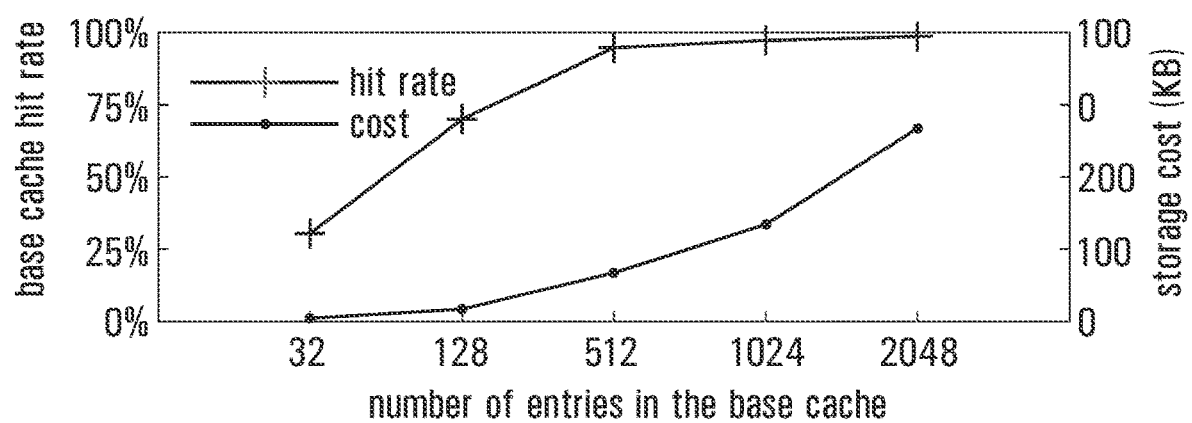
FIG. 20 depicts base cache hit rate and storage cost for different base cache sizes, according to an example embodiment.

To determine the effect of the size of the base cache, sizes ranging from 32 to 2048 entries for the base cache were tested; results are shown in FIG. 20, which graphs base cache hit rate (left axis) and storage cost (right axis) for different base cache sizes. Compared to a 94.8% hit rate for a 512-entry cache (33 KB), a 2048-entry cache (+100 KB storage) increases the hit rate by only 3.9%; therefore a 512-entry base cache was used for the remainder of the experiments.

On average, this cache has a 5.2% miss rate over all benchmarks; however, all but 8% of misses (i.e., all but 0.5% of accesses) miss when a line is being inserted in the cache, and are off the critical path. Because the data is inserted uncompressed while the clusteroid (base block) is fetched into the cache, these misses represent a missed compression opportunity but do not affect insertion latency.

Additional Applications

As mentioned above, at least some example embodiments may be applied to non-cache applications. For example, at least some example embodiments involve applying the above-described compression methods to a storage structure that has a random-access pattern in which relatively small chunks of data are retrieved by providing addresses for each chunk, such as in a RAM, rather than as a sequence of data such as when reading a file. In an example where data compressed is in RAM rather than a cache, the page table for the RAM may take the place of the tag array of the cache. More generally speaking, in at least some embodiments a fingerprint array storing one or more base block fingerprints may be used in lieu of the tag array in certain cache implementations. These example embodiments comprise compressing on-chip memories that are not caches, such as scratchpads or buffers; compressing off-chip memories, such as off-chip DRAM; compressing structures that track metadata, such as TLBs and similar structures; and compressing data in other storage media, such as in SSD/flash memory, hard drives, and tapes.

Certain example embodiments also involve non-storage applications. For example, in at least some embodiments a line of data is compressed as it is retrieved from DRAM (on the memory side) and the compressed version is sent over the wires or communication channel that leads to a CPU, thereby effectively increasing memory bandwidth than capacity, and potentially saving energy. In such embodiments, a base array on each end of the communication (e.g., on the CPU side and the memory side) is maintained and used to synchronize the two ends of the communication. More generally, certain embodiments apply this to any suitable form of data transmission, and not just communication between a memory and a CPU. Also more generally, certain other embodiments apply the above described compression methods to in-memory computation or near-memory computing as demonstrated in this example in which data is communicated between a DRAM and CPU.

The embodiments have been described above with reference to flow, sequence, and block diagrams of methods, apparatuses, systems, and computer program products. In this regard, the depicted flow, sequence, and block diagrams illustrate the architecture, functionality, and operation of implementations of various embodiments. For instance, each block of the flow and block diagrams and operation in the sequence diagrams may represent a module, segment, or portion of code, which comprises one or more executable instructions for implementing the specified action(s). In some alternative embodiments, the action(s) noted in that block or operation may occur out of the order noted in those figures. For example, two blocks or operations shown in succession may, in some embodiments, be executed substantially concurrently, or the blocks or operations may sometimes be executed in the reverse order, depending upon the functionality involved. Some specific examples of the foregoing have been noted above but those noted examples are not necessarily the only examples. Each block of the flow and block diagrams and operation of the sequence diagrams, and combinations of those blocks and operations, may be implemented by special purpose hardware-based systems that perform the specified functions or acts, or combinations of special purpose hardware and computer instructions.

The terminology used herein is for the purpose of describing particular embodiments only and is not intended to be limiting. Accordingly, as used herein, the singular forms "a", "an", and "the" are intended to include the plural forms as well, unless the context clearly indicates otherwise. It will be further understood that the terms "comprises" and "comprising", when used in this specification, specify the presence of one or more stated features, integers, steps, operations, elements, and components, but do not preclude the presence or addition of one or more other features, integers, steps, operations, elements, components, and groups. Directional terms such as "top", "bottom", "upwards", "downwards", "vertically", and "laterally" are used in the following description for the purpose of providing relative reference only, and are not intended to suggest any limitations on how any article is to be positioned during use, or to be mounted in an assembly or relative to an environment. Additionally, the term "connect" and variants of it such as "connected", "connects", and "connecting" as used in this description are intended to include indirect and direct connections unless otherwise indicated. For example, if a first device is connected to a second device, that coupling may be through a direct connection or through an indirect connection via other devices and connections. Similarly, if the first device is communicatively connected to the second device, communication may be through a direct connection or through an indirect connection via other devices and connections. The term "and/or" as used herein in conjunction with a list means any one or more items from that list. For example, "A, B, and/or C" means "any one or more of A, B, and C".

The controller used in the foregoing embodiments may comprise, for example, a processing unit (such as a processor, microprocessor, or programmable logic controller) communicatively coupled to a non-transitory computer readable medium having stored on it program code for execution by the processing unit, microcontroller (which comprises both a processing unit and a non-transitory computer readable medium), field programmable gate array (FPGA), system-on-a-chip (SoC), an application-specific integrated circuit (ASIC), or an artificial intelligence accelerator. Examples of computer readable media are non-transitory and include disc-based media such as CD-ROMs and DVDs, magnetic media such as hard drives and other forms of magnetic disk storage, semiconductor based media such as flash media, random access memory (including DRAM and SRAM), and read only memory.

It is contemplated that any part of any aspect or embodiment discussed in this specification can be implemented or combined with any part of any other aspect or embodiment discussed in this specification.

In construing the claims, it is to be understood that the use of computer equipment, such as a processor, to implement the embodiments described herein is essential at least where the presence or use of that computer equipment is positively recited in the claims.

One or more example embodiments have been described by way of illustration only. This description is being presented for purposes of illustration and description, but is not intended to be exhaustive or limited to the form disclosed. It will be apparent to persons skilled in the art that a number of variations and modifications can be made without departing from the scope of the claims.

The invention claimed is:

1. A data compression method comprising:
   (a) determining that a cluster fingerprint of a first uncompressed data block corresponds to a cluster fingerprint of a first base block stored in a base array, wherein the determining comprises looking up the cluster fingerprint of the first base block from the base array using the cluster fingerprint of the first uncompressed data block, and wherein the cluster fingerprint of the first uncompressed data block is based on content of the first uncompressed data block and the cluster fingerprint of the first base block is based on content of the first base block;
   (b) determining a difference between the first uncompressed data block and the first base block;
   (c) encoding a first compressed data block as a difference between the first uncompressed data block and the first base block; and
   (d) storing the first compressed data block in a data array.

2. The method of claim 1, wherein the compressed data block is encoded as
   (a) an identifier identifying which bits of the first uncompressed data block differ from the first base block; and
   (b) a first sequence of differing bits that differ between the first uncompressed data block and the first base block.

3. The method of claim 2, wherein the identifier comprises a bitmask.

4. The method of claim 2, wherein the identifier comprises indices identifying the bits of the first uncompressed data block that differ from the first base block.

5. The method of claim 1, wherein the data array comprises a map identifying a location of the first compressed data block in the data array, and wherein the method further comprises:
   (a) receiving an access request, the access request comprising a fingerprint array index;

(b) retrieving a segment index and the cluster fingerprint of the first base block from a fingerprint array storing one or more base block fingerprints using the fingerprint array index;
(c) retrieving the first base block from the base array using the cluster fingerprint of the first base block;
(d) retrieving the first compressed data block from the data array using the segment index and the map; and
(e) decompressing the first compressed data block using:
  (i) the first base block; and
  (ii) the difference between the first uncompressed data block and the first base block.

6. The method of claim 5, wherein the data array comprises part of a cache and the fingerprint array comprises a tag array of the cache.

7. The method of claim 5, wherein the data array comprises part of random access memory and the fingerprint array comprises a page table of the random access memory.

8. The method of claim 1, further comprising:
(a) determining that a cluster fingerprint of a second uncompressed data block corresponds to the cluster fingerprint of the first base block stored in the base array, wherein the determining comprises looking up the cluster fingerprint of the first base block from the base array using the cluster fingerprint of the second uncompressed data block, and wherein the cluster fingerprint of the second uncompressed data block is based on content of the second uncompressed data block;
(b) determining a difference between the second uncompressed data block and the first base block;
(c) encoding a second compressed data block as a difference between the second uncompressed data block and the first base block; and
(d) storing the second compressed data block in the data array.

9. The method of claim 8, wherein the data array comprises a map that identifies locations of respective data blocks in the data array and that comprises validity fields representing whether the respective blocks are valid, the method further comprising:
(a) determining that the first compressed data block is to be evicted from the data array in order to make space in the data array available for storage of the second compressed data block;
(b) setting the validity field of the map for the first compressed data block to invalid;
(c) evicting the first compressed data block from the data array, wherein the second compressed data block is stored in the data array at a location corresponding to a location previously occupied by the evicted first compressed data block; and
(d) setting the validity field of the map previously corresponding to the first compressed data block to valid.

10. The method of claim 1, further comprising:
(a) determining that a cluster fingerprint of a second uncompressed data block corresponds to none of the base block fingerprints stored in the base array, wherein the cluster fingerprint of the second uncompressed data block is based on content of the second uncompressed data block;
(b) determining that the first base block is unused for data compression;
(c) replacing the first base block in the base array with a second base block; and
(d) encoding a second compressed data block as a difference between the second uncompressed data block and the second base block.

11. The method of claim 10, wherein the second uncompressed data block is stored as the second base block, and wherein the second compressed data block is encoded to indicate that the second uncompressed data block is identical to the second base block.

12. The method of claim 1, wherein determining that the cluster fingerprint of the first uncompressed data block corresponds to the cluster fingerprint of the first base block comprises determining a similarity probability satisfies a probability threshold, wherein the similarity probability is a likelihood that a difference in distance metrics representing the cluster fingerprints satisfies a distance threshold.

13. The method of claim 12, wherein determining the similarity probability satisfies the probability threshold comprises determining that a locality-sensitive hash of the first uncompressed data block is identical to a locality-sensitive hash of the first base block.

14. The method of claim 13, wherein determining the locality-sensitive hash of the first uncompressed data block or the first base block comprises:
(a) multiplying the first uncompressed data block or the first base block by a matrix with entries selected from $\{-1,0,1\}$ to arrive at an intermediate vector product; and
(b) determining the locality-sensitive hash based on whether each scalar entry comprising the intermediate vector product is positive or negative.

15. A non-transitory computer readable medium having stored thereon computer program code that is executable by a processor and that, when executed by the processor, causes the processor to perform a data compression method comprising:
(a) determining that a cluster fingerprint of a first uncompressed data block corresponds to a cluster fingerprint of a first base block stored in a base array, wherein the determining comprises looking up the cluster fingerprint of the first base block from the base array using the cluster fingerprint of the first uncompressed data block, and wherein the cluster fingerprint of the first uncompressed data block is based on content of the first uncompressed data block and the cluster fingerprint of the first base block is based on content of the first base block;
(b) determining a difference between the first uncompressed data block and the first base block;
(c) encoding a first compressed data block as a difference between the first uncompressed data block and the first base block; and
(d) storing the first compressed data block in a data array.

16. A system comprising:
(a) a memory having stored thereon:
  (i) a base array storing the first base block; and
  (ii) a data array; and
(b) a controller communicatively coupled to the memory and configured to perform a method comprising:
  (i) determining that a cluster fingerprint of a first uncompressed data block corresponds to a cluster fingerprint of a first base block stored in a base array, wherein the determining comprises looking up the cluster fingerprint of the first base block from the base array using the cluster fingerprint of the first uncompressed data block, and wherein the cluster fingerprint of the first uncompressed data block is based on content of the first uncompressed data block and the cluster fingerprint of the first base block is based on content of the first base block;

(ii) determining a difference between the first uncompressed data block and the first base block;

(iii) encoding a first compressed data block as a difference between the first uncompressed data block and the first base block; and (iv) storing the first compressed data block in the data array.

17. The system of claim 16, wherein the compressed data block is encoded as:

(a) an identifier identifying which bits of the first uncompressed data block differ from the first base block; and (b) a first sequence of differing bits that differ between the first uncompressed data block and the first base block.

18. The system of claim 17, wherein the identifier comprises a bitmask.

19. The system of claim 17, wherein the identifier comprises indices identifying the bits of the first uncompressed data block that differ from the first base block.

20. The system of claim 16, wherein the memory has stored thereon a fingerprint array storing one or more base block fingerprints, wherein the data array comprises a map identifying a location of the first compressed data block in the data array, and wherein the method that the controller is configured to perform further comprises:

(a) receiving an access request, the access request comprising a fingerprint array index;

(b) retrieving a segment index and the cluster fingerprint of the first base block from the fingerprint array using the fingerprint array index;

(c) retrieving the first base block from the base array using the cluster fingerprint of the first base block;

(d) retrieving the first compressed data block from the data array using the segment index and the map; and (e) decompressing the first compressed data block using:
(i) the first base block; and
(ii) the difference between the first uncompressed data block and the first base block.

21. The system of claim 20, wherein the data array comprises part of a cache comprising multiple cachelines, wherein the fingerprint array comprises a tag array of the cache, and wherein the adder tree and the comparator determine the locality-sensitive hash for at least one of the cachelines.

22. The system of claim 20, wherein the data array comprises part of random access memory and the fingerprint array comprises a page table of the random access memory.

23. The system of claim 16, wherein the method that the controller is configured to perform further comprises:

(a) determining that a cluster fingerprint of a second uncompressed data block corresponds to the cluster fingerprint of the first base block stored in the base array, wherein the determining comprises looking up the cluster fingerprint of the first base block from the base array using the cluster fingerprint of the second uncompressed data block, and wherein the cluster fingerprint of the second uncompressed data block is based on content of the second uncompressed data block;

(b) determining a difference between the second uncompressed data block and the first base block;

(c) encoding a second compressed data block as a difference between the second uncompressed data block and the first base block; and (d) storing the second compressed data block in the data array.

24. The system of claim 23, wherein the data array comprises a map that identifies locations of respective data blocks in the data array and that comprises validity fields representing whether the respective blocks are valid, and wherein the method that the controller is configured to perform further comprises:

(a) determining that the first compressed data block is to be evicted from the data array in order to make space in the data array available for storage of the second compressed data block;

(b) setting the validity field of the map for the first compressed data block to invalid;

(c) evicting the first compressed data block from the data array, wherein the second compressed data block is stored in the data array at a location corresponding to a location previously occupied by the evicted first compressed data block; and (d) setting the validity field of the map previously corresponding to the first compressed data block to valid.

25. The system of claim 16, wherein the method that the controller is configured to perform further comprises:

(a) determining that a cluster fingerprint of a second uncompressed data block corresponds to none of the base block fingerprints stored in the base array, wherein the cluster fingerprint of the second uncompressed data block is based on content of the second uncompressed data block;

(b) determining that the first base block is unused for data compression;

(c) replacing the first base block in the base array with a second base block; and (d) encoding a second compressed data block as a difference between the second uncompressed data block and the second base block.

26. The system of claim 25, wherein the second uncompressed data block is stored as the second base block, and wherein the second compressed data block is encoded to indicate that the second uncompressed data block is identical to the second base block.

27. The system of claim 16, wherein determining that the cluster fingerprint of the first uncompressed data block corresponds to the cluster fingerprint of the first base block comprises determining a similarity probability satisfies a probability threshold, wherein the similarity probability is a likelihood that a difference in distance metrics representing the cluster fingerprints satisfies a distance threshold.

28. The system of claim 27, wherein determining the similarity probability satisfies the probability threshold comprises determining that a locality-sensitive hash of the first uncompressed data block is identical to a locality-sensitive hash of the first base block.

29. The system of claim 28, wherein determining the locality-sensitive hash of the first uncompressed data block or the first base block comprises:

(a) multiplying the first uncompressed data block or the first base block by a matrix with entries selected from $\{-1,0,1\}$ to arrive at an intermediate vector product; and (b) determining the locality-sensitive hash based on whether each scalar entry comprising the intermediate vector product is positive or negative.

30. The system of claim 28, further comprising an adder tree having an output communicatively coupled to a comparator, wherein the first uncompressed data block or the first base block is input to the adder tree and the comparator outputs the locality-sensitive hash of the first uncompressed data block or the first base block.

* * * * *

UNITED STATES PATENT AND TRADEMARK OFFICE
CERTIFICATE OF CORRECTION

| | | |
|---|---|---|
| PATENT NO. | : 11,245,415 B2 | Page 1 of 1 |
| APPLICATION NO. | : 17/200403 | |
| DATED | : February 8, 2022 | |
| INVENTOR(S) | : Amin Ghasemazar et al. | |

It is certified that error appears in the above-identified patent and that said Letters Patent is hereby corrected as shown below:

On the Title Page

The Assignee is listed as:
"(73) Assignee: THE UNIVERSITY OF BRITISH COLUMBIA
UNIVERSITY-INDUSTRY LIAISON OFFICE, Vancouver (CA)"
The Assignee should be:
"(73) Assignee: THE UNIVERSITY OF BRITISH COLUMBIA, Vancouver (CA)"

Signed and Sealed this
Twelfth Day of November, 2024

Katherine Kelly Vidal
*Director of the United States Patent and Trademark Office*